United States Patent
Matias

(10) Patent No.: US 10,243,105 B2
(45) Date of Patent: *Mar. 26, 2019

(54) GROUP-III NITRIDE DEVICES AND SYSTEMS ON IBAD-TEXTURED SUBSTRATES

(71) Applicant: iBeam Materials, Inc., Santa Fe, NM (US)

(72) Inventor: Vladimir Matias, Santa Fe, NM (US)

(73) Assignee: iBeam Materials, Inc., Santa Fe, NM (US)

(*) Notice: Subject to any disclaimer, the term of this patent is extended or adjusted under 35 U.S.C. 154(b) by 0 days.

This patent is subject to a terminal disclaimer.

(21) Appl. No.: 15/675,598

(22) Filed: Aug. 11, 2017

(65) Prior Publication Data

US 2018/0351040 A1 Dec. 6, 2018

Related U.S. Application Data

(63) Continuation-in-part of application No. 15/041,017, filed on Feb. 10, 2016, now Pat. No. 9,735,318.

(Continued)

(51) Int. Cl.
  *H01L 33/32* (2010.01)
  *H01L 33/64* (2010.01)
  *H01L 33/18* (2010.01)

(52) U.S. Cl.
  CPC ............ *H01L 33/32* (2013.01); *H01L 33/18* (2013.01); *H01L 33/644* (2013.01)

(58) Field of Classification Search
  CPC ......... H01L 33/32; H01L 21/02; H01L 33/02; H01L 27/15; H01L 27/32; H01L 33/16

(Continued)

(56) References Cited

U.S. PATENT DOCUMENTS

| 5,259,885 A | 11/1993 | Sandhage |
| 5,470,820 A | 11/1995 | Hauser et al. |

(Continued)

FOREIGN PATENT DOCUMENTS

| DE | 10352655 | 6/2005 |
| EP | 2779213 | 9/2014 |

(Continued)

OTHER PUBLICATIONS

"F10 LED Neon Strip", http://www.cquip.com/shop_-157253251.php, 2015.

(Continued)

*Primary Examiner* — Caleen Sullivan
(74) *Attorney, Agent, or Firm* — Peacock Law P.C.; Philip D. Askenazy; Deborah A. Peacock

(57) ABSTRACT

A multilayer structure including a hexagonal epitaxial layer, such as GaN or other group III-nitride (III-N) semiconductors, a <111> oriented textured layer, and a non-single crystal substrate, and methods for making the same. The textured layer has a crystalline alignment preferably formed by the ion-beam assisted deposition (IBAD) texturing process and can be biaxially aligned. The in-plane crystalline texture of the textured layer is sufficiently low to allow growth of high quality hexagonal material, but can still be significantly greater than the required in-plane crystalline texture of the hexagonal material. The IBAD process enables low-cost, large-area, flexible metal foil substrates to be used as potential alternatives to single-crystal sapphire and silicon for manufacture of electronic devices, enabling scaled-up roll-to-roll, sheet-to-sheet, or similar fabrication processes to be used. The user is able to choose a substrate for its mechanical and thermal properties, such as how well its coefficient of thermal expansion matches that of the hexagonal epitaxial layer, while choosing a textured layer (Continued)

that more closely lattice matches that layer. Electronic devices such as LEDs can be manufactured from such structures. Because the substrate can act as both a reflector and a heat sink, transfer to other substrates, and use of external reflectors and heat sinks, is not required, greatly reducing costs. Large area devices such as light emitting strips or sheets may be fabricated using this technology.

42 Claims, 33 Drawing Sheets

Related U.S. Application Data

(60) Provisional application No. 62/262,815, filed on Dec. 3, 2015, provisional application No. 62/114,504, filed on Feb. 10, 2015.

(58) Field of Classification Search
USPC .......................................................... 257/76
See application file for complete search history.

(56) References Cited

U.S. PATENT DOCUMENTS

| | | | |
|---|---|---|---|
| 6,371,637 | B1 | 4/2002 | Atchinson et al. |
| 7,510,641 | B2 | 3/2009 | Kreiskott et al. |
| 8,492,185 | B1 | 7/2013 | D'Evelyn et al. |
| 9,735,318 | B2 * | 8/2017 | Matias ................ H01L 33/32 |
| 2003/0015725 | A1 | 1/2003 | Droopad et al. |
| 2003/0207767 | A1 | 11/2003 | Kim et al. |
| 2004/0037079 | A1 | 2/2004 | Luk |
| 2006/0033160 | A1 | 2/2006 | Findikoglu et al. |
| 2006/0172892 | A1 | 8/2006 | Han et al. |
| 2006/0276344 | A1 | 12/2006 | Paranthaman et al. |
| 2008/0197327 | A1 | 8/2008 | Arendt et al. |
| 2008/0230779 | A1 | 9/2008 | Goyal |
| 2008/0265255 | A1 | 10/2008 | Goyal |
| 2009/0110915 | A1 | 4/2009 | Findikoglu |
| 2009/0278233 | A1 | 11/2009 | Pinnington et al. |
| 2010/0013052 | A1 | 1/2010 | Kulkarni et al. |
| 2010/0039813 | A1 | 2/2010 | Sloan et al. |
| 2010/0061089 | A1 | 3/2010 | Lin et al. |
| 2010/0079989 | A1 | 4/2010 | Yeh |
| 2010/0112192 | A1 | 5/2010 | Li et al. |
| 2010/0157584 | A1 | 6/2010 | Ho |
| 2010/0232175 | A1 | 9/2010 | Ho |
| 2010/0252805 | A1 | 10/2010 | Chu et al. |
| 2011/0062446 | A1 | 3/2011 | Goyal |
| 2011/0079766 | A1 | 4/2011 | Wildeson et al. |
| 2011/0160065 | A1 | 6/2011 | Aytug et al. |
| 2011/0211357 | A1 | 9/2011 | Preuschl et al. |
| 2012/0040100 | A1 | 2/2012 | Matias et al. |
| 2012/0146023 | A1 | 6/2012 | Craft et al. |
| 2012/0273751 | A1 | 11/2012 | Chang et al. |
| 2012/0288673 | A1 | 11/2012 | Clemens et al. |
| 2013/0021811 | A1 | 1/2013 | Goldwater |
| 2013/0143336 | A1 | 6/2013 | Jain |
| 2014/0104838 | A1 | 4/2014 | Reiss et al. |
| 2014/0334142 | A1 | 11/2014 | Levante et al. |
| 2015/0092413 | A1 | 4/2015 | Li et al. |
| 2015/0311073 | A1 | 10/2015 | Srinivasan et al. |
| 2015/0357290 | A1 | 12/2015 | Hsu et al. |
| 2017/0045187 | A1 | 2/2017 | Li et al. |

FOREIGN PATENT DOCUMENTS

| | | |
|---|---|---|
| KR | 1020070092051 | 2/2007 |
| KR | 1020120113988 | 10/2012 |
| KR | 10-1232507 | 2/2013 |
| WO | 2016176266 | 11/2016 |
| WO | 2017005234 | 1/2017 |

OTHER PUBLICATIONS

"Neon Flex Led Strip", http://www.boating.business.com/product-news/lighting/neon-flex-led-strip, 2016.

"User Manual LED Neon Ribbon Light F10, Version No. V1.1", 2015.

Bour, D. P., et al., "Polycrystalline nitride semiconductor light-emitting diodes fabricated on quartz substrates", Applied Physics Letters, Apr. 17, 2000, 2182-2184.

Cho, Jaehee, et al., "Efficiency droop in light-emitting diodes: Challenges and countermeasures", Laser & Photonics Review; vol. 7; No. 3, 2013, 408-421.

Dai, Qi, et al., "Carrier recombination mechanisms and efficiency droop in GaInN/GaN", Applied Physics Letters 97; Issue 13, 2010, 133507-1-133507-3.

David, Aurelien, et al., "Influence of polarization fields on carrier lifetime and recombination rates in InGaN-based light-emitting diodes", Applied Physics Letters 97; Issue 3, 2010, 033501-1-033501-3.

De Santi, C, et al., "Role of defects in the thermal droop of InGaN-based light emitting diodes", Journal of Applied Physics 119; No. 9, 2016, 094501-1-094501-10.

Foltyn, S. R., et al., "Materials science challenges for high-temperature superconducting wire", Nature Materials, Sep. 2007, 631-642.

Gerlach, J. W., et al., "Control of the crystalline quiality of wurtzitic GaN films deposited on y-LiAlO2 by ion-beam assisted molecular-beam epitaxy", Nuclear Instruments and Methods in Physics Research B, Apr. 2007, 315-319.

Groves, James R., et al., "Biaxially-textured photovoltaic film crystal silicon on ion beam assisted deposition CaF2 seed layers on glass", Energy Environmental Science, 2012, 6905-6908.

Guillen, C. , et al., "Leveling effect of sol-gel SiO2 coatings onto metallic foil substrates", Surface and Coatings Technology, 2001, 205-210.

Hanisch, Jens , et al., "Stacks of YBCO Films Using Multiple IBAD Templates", IEEE Transactions on Applied Superconductivity, Jun. 2007, 3577-3580.

Hu, Wencheng, et al., "The Surface Morphology of Ba0.65Sr0.35TiO3 Thin Film by Sol-Gel Method", Integrated-Ferroelectronics, 2005, 1-11.

Jeon, Chan-Wook, et al., "Epitaxial growth of gallium nitride by ion-beam-assisted evaporation", Thin Solid Films, Dec. 1, 1995, 16-21.

Kreiskott, Sascha, et al., "Continuous electropolishing of Hastelloy substrates for Ion-beam Assisted deposition of MgO", Superconductor Science and Technology, 2003, 613-616.

Larsen, Rasmus, "An introduction to MicroLED; a new self-emitting display technology", http://www.flatpanelshd.com/focus.php?subaction=showfull&id=1477048275, Oct. 21, 2016.

Lu Rongtao, et al., "Development of textured MgO templates on nonmetallic flexible ceraflex", Applied Physics Letters, 2006, 132505-1-132505-3.

Mach, Jindrich, et al., "Optimization of ion-atomic beam source for deposition of GaN ultrathin films", Review of Scientific Instruments, Aug. 2014.

Matias, Vladimir, et al., "Coated Conductor Template Research", Annual Superconductivity for Electric Systems Peer Review, Jul. 30, 2008.

Matias, et al., "Coated Conductor Template Research", High Temperature Superconductivity Program Peer Review (summary), 2009.

Matias, Vladimir, et al., "Ion beam induced crystalline texturing during thin film deposition", Surface & Coatings Technology, 2015, 1-8.

Matias, Vladimir, et al., "Preparation of Substrates for IBAD-MgO Coated Conductors (abstract only)", Mater. Res. Soc. Symp. Proc., 2007.

Matias, Vladimir, et al., "Sustaining Innovation in Coated Conductors IBAD Template and Reactive Co-evaporation", Superconductivity for Electric Systems Annual Peer Review, Arlington, VA, Aug. 8-9, 2007.

Matias, Vladimir, et al., "Very fast biaxial texture evolution using high rate ion-beam-assisted deposition of MgO", Journal of Materials Research, Jan. 2009, 125-129.

(56) References Cited

OTHER PUBLICATIONS

Matias, Vladimir, et al., "YBCO films grown by reactive co-evaporation on simplified IBAD-MgO coated conductor templates", Superconductor Science and Technology, Dec. 9, 2009, 1-5.

Nakamura, Shuji, et al., "Candela-class high-brightness InGaN/AlGaN double-heterstructure blue-light-emitting diodes", Applied Physics Letters, Mar. 28, 1994, 1687-1689.

Sheehan, Chris, et al., "Solution deposition planarization of long-length flexible substrates", Applied Physics Letters, Feb. 2011, 071907-1-071907-3.

Shimada, Toshihiro, "Artificial Grain Alignment of Organic Crystalline Thin Fil ms", MRS Proceedings, 2008.

Shon, Jeong Woo, et al., "Fabrication of full-color InGaN-based light-emitting diodes on amorphous substrates by pulsed sputtering", Scientific Reports, Jun. 23, 2014.

Stillwagon, L. E., et al., "Fundamentals of topographic substrate leveling", Journal of Applied Physics, Jun. 1, 1988, 5251-5258.

Stillwagon, L. E., et al., "Planarization of Substrate Topography by Spin Coating (abstract only)", Journal of the Electrochemical Society, Aug. 1987, 2030-2037.

Stritzker, Bernd, et al., "Ion Beam Assisted Texture Evolution During Thin Film Deposition of Metal Nitrides", MRS Proceedings, Jan. 2000.

Wang, C. P., et al., "Deposition of in-plane textured MgO on amorphous Si3N4 substrates by ion-beam-assisted deposition and comparisons with ion-beam-assisted deposited yttria-stabilized-zirconia", Applied Physics Letters, Nov. 17, 1997, 2955-2957.

Gonzalez-Elipe, A. R., et al., "Texture Development", Low Energy Ion Assisted Film Growth, Imperial College Press, 2003, 137-153.

\* cited by examiner

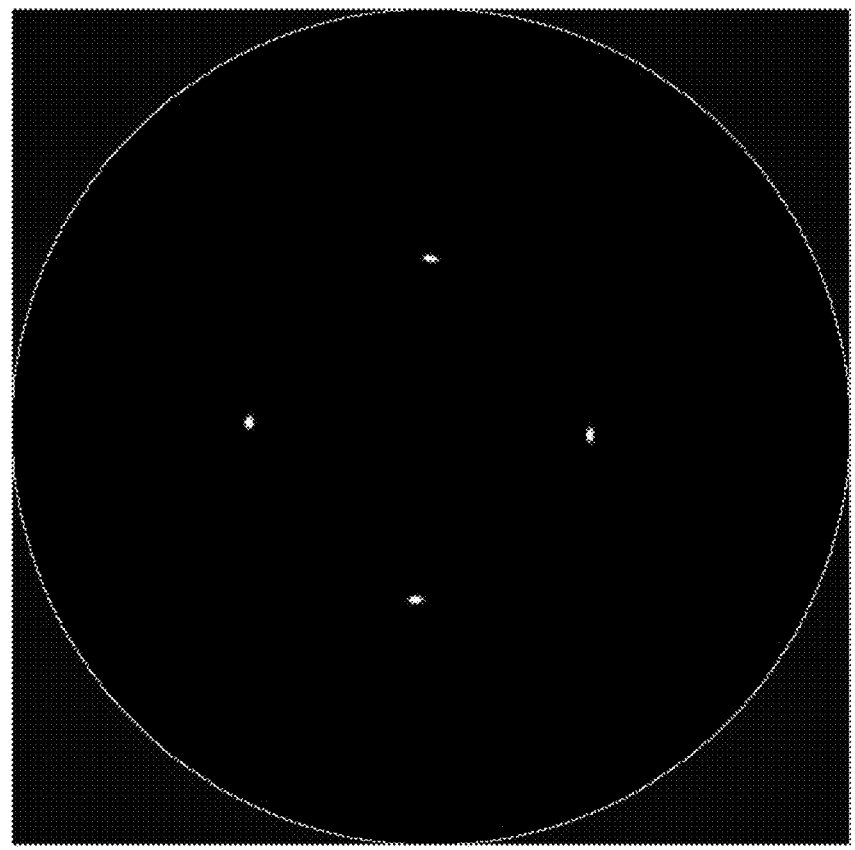
FIG. 3
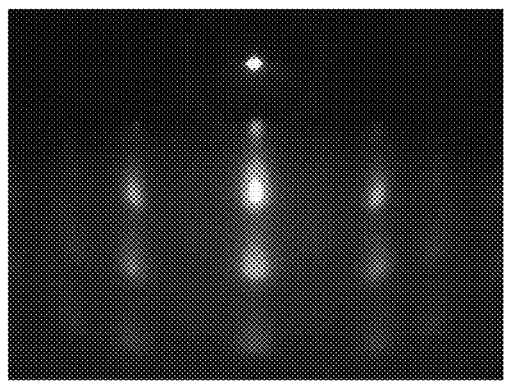 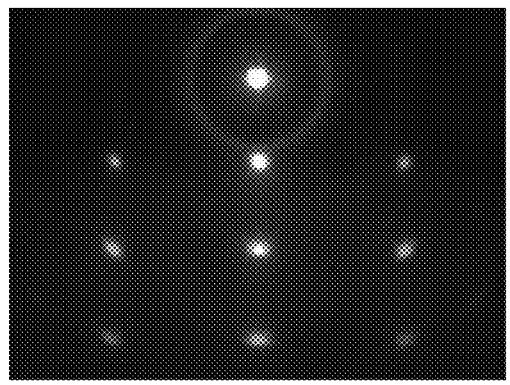
FIG. 4A          FIG. 4B

GROUP-III NITRIDE DEVICES AND SYSTEMS ON IBAD-TEXTURED SUBSTRATES

CROSS-REFERENCE TO RELATED APPLICATIONS

This application is a continuation-in-part application of U.S. patent application Ser. No. 15/041,017, entitled "Epitaxial Hexagonal Materials on IBAD-Textured Substrates", filed on Feb. 10, 2016 and issuing on Aug. 15, 2017 as U.S. Pat. No. 9,735,318, which application claims priority to and the benefit of the filing of U.S. Provisional Patent Application Ser. No. 62/114,504, entitled "IBAD-Textured Substrates for Growth of Epitaxial Group-III Nitride Materials and Method of Making the Same", filed on Feb. 10, 2015, and U.S. Provisional Patent Application Ser. No. 62/262,815, entitled "IBAD-Textured Substrates for Growth of Epitaxial Group-III Nitride Materials and Method of Making the Same", filed on Dec. 3, 2015. The specification and claims thereof are incorporated herein by reference.

FEDERALLY SPONSORED RESEARCH OR DEVELOPMENT

The U.S. Government has a paid-up license in this invention and the right in limited circumstances to require the patent owner to license others on reasonable terms as provided for by the terms of Assistance Agreement No. AR0000447 awarded by the U.S. Department of Energy's Advanced Research Projects Agency-Energy.

BACKGROUND OF THE INVENTION

Field of the Invention (Technical Field)

The present invention relates epitaxial growth of a layer of a hexagonal material, such as gallium nitride (GaN) or other group III-nitride (III-N) semiconductors, on a substrate whose crystalline alignment is formed by the ion-beam assisted deposition (IBAD) texturing process. In one embodiment, IBAD textured layers are used to prepare biaxially aligned thin films or substrates which are single-crystal-like in nature. These IBAD thin films or templates support subsequent deposition of optional epitaxial buffer layers followed by GaN or III-N epitaxial growth. An electronic component that includes III-N epitaxy on an ion-beam textured layer with intermediate epitaxial buffer layers on top and a method of forming the same are disclosed.

An embodiment of the present invention is an ion beam assisted deposition (IBAD) texturing process for biaxially aligned films as templates for GaN epitaxy. The IBAD process enables low-cost, large-area, flexible metal foil substrates to be used as potential alternatives to single-crystal sapphire and silicon for electronic devices. Epitaxial GaN films are grown by the MOCVD process on these engineered flexible substrates, which enables scaled-up roll-to-roll, sheet-to-sheet, or similar fabrication processes to be used. GaN films having a thickness of several microns on polycrystalline metal foils that have in-plane and out-of-plane alignment of less than 1° have been manufactured. The epitaxial GaN films on polycrystalline metal foil are used as a template layer to make multi-quantum well light emitting diode (LED) structures and have successfully demonstrated electro-luminescence. These are the first LED devices fabricated directly on metal foil, and can be scaled up using a roll-to-roll process. Thus epitaxial-GaN layers, i.e. single-crystal-like quality material, can be deposited directly (with no transfer) on top of polycrystalline flexible metal foils by use of intermediate ion-beam assist deposited (IBAD) textured layers. Such epi-GaN layers can then be used as buffer layers for GaN-based device structures.

Background Art

Note that the following discussion may refer to a number of publications and references. Discussion of such publications herein is given for more complete background of the scientific principles and is not to be construed as an admission that such publications are prior art for patentability determination purposes.

Light-emitting diodes (LEDs) are revolutionizing the way the world is implementing lighting at the start of the 21st century. Not only are LEDs more efficient light sources, but they have the ability to be implemented in many different forms compared to other light sources and to have their spectrum adjusted for application as well as modified in time. However, the greatest barrier still holding back LEDs from completely replacing incandescent and fluorescent lighting is cost of the LED luminaire systems. Although LED lighting has made great strides in penetrating the lighting market, it is currently mostly focused in the niche high-end lighting space and still far from a mainstream application in commercial lighting where it is hard to compete in cost with simple fluorescent tubes. For LEDs to dominate the whole lighting market the cost of LED lighting will still have to come down by several orders of magnitude. This is in spite of the fact that the LED chip and package costs have already come down incredibly by several orders of magnitude in the past decade. The cost of packaged LEDs today can even be less than $0.50/klm, compared to an average LED package price of $50/klm a decade ago. There is still room to go in reducing cost by another factor of 2 or 3 using current fabrication techniques. To go significantly further in cost reduction one has to tackle the critical issue of scale in manufacturing of the LED chips and packages as well as reduction in the cost of other parts of the luminaire system. The packaged LEDs are used as surface mounted devices (SMD) and typically implemented with a pick-and-place (P&P) technology in lighting devices. P&P machines are automated ways of mounting SMDs mechanically. Eliminating SMD's and P&P would simplify the LED luminaire considerably and reduce costs. The way semiconductor industry does scale up of semiconductor chips is to increase the substrate size incrementally from 2-inch to 4-inch and now going to 6-inch single-crystal wafers. Most of blue LED production today is done using a GaN platform on sapphire. High-quality epitaxial GaN is deposited usually by metal-organic chemical vapor deposition on sapphire (MOCVD, sometimes called OMVPE or organo-metallic vapor phase epitaxy) and then used as a platform for subsequent deposition of epitaxial device structures.

GaN and related group III-N materials are used for numerous applications, including light emitting diodes (LEDs), laser diodes (LDs), and transistor devices such as high-electron mobility transistors (HEMTs). The vast majority of today's GaN layers are deposited epitaxially on single-crystal substrates such as sapphire, silicon, silicon carbide, or gallium nitride. However, single-crystal substrates are typically rigid, expensive, and readily available in diameters of only less than 100 mm, except for silicon wafers. An exception to single-crystal substrates is the development of ion-beam assisted deposition (IBAD) of single-crystal like thin films on flexible substrates. In the last decade, IBAD texturing of thin films on flexible metal has been notably been developed for long lengths of superconducting crystals for electrical wire applications.

When typically growing GaN using MOCVD (metal-organic chemical vapor deposition) on single-crystal substrates that are not native (i.e. heteroepitaxially), a two-step deposition process is used whereby an initial GaN nucleation layer (NL) is deposited at a relatively low temperature (500-600° C.) to facilitate GaN nucleation and evolution. In the second step, the fully coalesced epitaxial GaN layer is then grown at a higher temperature (>1000° C.) to obtain device quality GaN material on top of the NL. Limiting the growth of GaN to lattice-matched single-crystal substrates reduces the number of practical substrates to sapphire ($Al_2O_3$), SiC, and bulk-GaN, which can be expensive and unavailable in large sizes. More recently Si has been developed as a single crystal substrate for GaN epitaxy and is becoming more widespread. Despite the adoption of Si as a potential alternative substrate to sapphire, direct growth of GaN on metal and other substrates is desired for practical applications that need large area or flexible substrates. Thus far it has not been possible to grow single-crystal GaN directly on metal or other non-oriented substrates due to the lack of epitaxial registry. GaN on metal or other non-oriented substrates has been achieved by transfer of the grown epitaxial GaN layer onto the foreign substrate, or by transferring an oriented film such as graphene and growing GaN on top of the graphene.

Previous IBAD texturing in fluorites was not developed, not easy to work with, and the IBAD texture widths were more than 15° in-plane FWHM. Thus IBAD (111) was not thought to be of sufficient quality to produce high-quality semiconductor materials with in-plane alignment of <1°. The best semiconductor Si results on (111) IBAD had in-plane texture FWHM of >10° and out-of-plane texture 1.5°. Thus typical semiconductor materials on IBAD are of inferior quality for devices and cannot compete with semiconductors on single crystal substrates. Good quality LED and other devices have not been produced. Several previous attempts to make GaN devices have been unsuccessful, since the materials have not been of high enough quality in terms of crystalline perfection and carrier mobility.

LEDs are revolutionizing lighting in the world due to their increased efficiency compared to other light sources and their spectrum tunability. However, LEDs are difficult to scale up further in manufacturing. Currently InGaN LEDs are produced primarily on 4-inch and 6-inch sapphire wafers and then diced into small dies. Larger sapphire wafers have significant issues in manufacturing due to a CTE mismatch and consequent substrate bowing. LED manufacturing cost is therefore likely not to decrease much further in the current paradigm of GaN-on-sapphire due to a lack of suitable scale up. In addition, LED costs are dominated by relatively expensive epi layers. The epi cost is still dominated by substrate cost and lack of suitable scale up. Therefore devices are limited to small areas and LEDs are packaged as individual devices and used as surface mounted devices (SMD). This requires complicated pick-and-place (P&P) mechanical machinery and lacks compact integration. Furthermore, backend wafer processing and packaging of LEDs is rather complex involving dozens of steps, contributing significantly to LED cost. About ¼ of an LED package cost is in backend processing and ½ is in packaging. Finally, LED performance is hindered by the existence of "droop," loss of efficiency at high operating current density. In order to maximize light output per unit area manufacturers of devices are required to inject high current densities in LEDs which limits their performance due to efficiency droop. Typical operating points for high brightness LEDs are around 30 $A/cm^2$ where there is a 10-20% reduction in efficiency. Furthermore, LEDs exhibit a thermal droop, i.e. a reduction in optical power when temperature is increased. At a 100° C. this is typically a 10-20% reduction.

SUMMARY OF THE INVENTION
(DISCLOSURE OF THE INVENTION)

The present invention is a multilayer structure comprising an epitaxial hexagonal crystal layer, a layer of a cubic material having a <111> out of plane orientation and having an in-plane crystalline texture with a full width half maximum (FWHM) less than or equal to approximately 15°, and a non-single crystal substrate. The epitaxial hexagonal crystal layer preferably comprises a group III-nitride semiconductor such as GaN. The epitaxial hexagonal crystal layer preferably serves a template layer for a light-emitting diode (LED). The layer of cubic material preferably has been textured by ion beam-assisted deposition (IBAD). The substrate can be amorphous, polycrystalline, flexible, ductile, metallic, ceramic, glass, plastic, or polymer. The epitaxial hexagonal crystal layer was preferably grown using metal-organic chemical vapor deposition (MOCVD), reactive sputtering, reactive evaporation, or molecular beam epitaxy (MBE). The coefficients of thermal expansion of the substrate and the epitaxial hexagonal crystal layer are preferably within approximately 12%, and more preferably within approximately 5%. If the epitaxial hexagonal crystal layer comprises GaN the substrate preferably comprises molybdenum, tungsten, tantalum, alloys thereof, Mo—Cu, or TZM. The layer of cubic material preferably has an in-plane crystalline texture having a FWHM of less than or equal to approximately 12°, or more preferably less than or equal to approximately 8°, or even more preferably less than or equal to approximately 5°. The layer of cubic material preferably comprises MgO, $CeO_2$, a bixbyite structure, $Sc_2O_3$, $Y_2O_3$, $Al_2O_3$, a fluorite structure, TiN, a rock salt structure, $CaF_2$, cubic $ZrO_2$, $HfO_2$, $ScO_x$, or $Mn_2O_3$. The structure preferably comprises a base layer disposed between the substrate and the layer of cubic material. The base layer preferably comprises amorphous $Al_2O_3$, $Y_2O_3$, or $SiO_2$. The structure preferably comprises one or more epitaxial buffer layers disposed between the layer of cubic material and the epitaxial hexagonal crystal layer. The epitaxial buffer layers preferably each have a lattice parameter that successively provides a transition from the lattice parameter of the cubic material to the lattice parameter of the epitaxial hexagonal crystal. If the epitaxial hexagonal crystal layer comprises GaN the epitaxial buffer layers preferably comprise a layer of $Sc_2O_3$ and a layer of Zr, and a layer of AlN. The FWHM of the in-plane texture of the layer of cubic material is optionally greater than an FWHM of an in-plane texture of the epitaxial hexagonal crystal layer. The invention is also an electronic or optoelectronic device comprising the multilayer structure of claim 1, such as an LED, MOSFET, MESFET, HEMT, Heterojunction FET, heterojunction bipolar transistor (HBT), thin-film transistor, sensor, memristor, laser diode (LD), SAW device, spintronic device, photodetector, or photovoltaic (PV) diode.

The present invention is also an electronic or optoelectronic device comprising a substrate on which an active region of the device was grown, said substrate acting as a reflector. The device can be an LED, MOSFET, MESFET, HEMT, Heterojunction FET, heterojunction bipolar transistor (HBT), thin-film transistor, sensor, memristor, laser diode (LD), SAW device, spintronic device, photodetector, or photovoltaic (PV) diode. The substrate preferably is a heat sink and has a thermal conductivity greater than approximately 25 W/m·K, more preferably greater than approximately 50 W/m·K. The substrate preferably comprises a metal or alloy, is preferably flexible, and is preferably not a single crystal. The device preferably comprises a light emitting region which is two-dimensional and not a point source, such as a sheet or strip. The device preferably comprises an LED on a metal substrate, wherein an operating temperature of the LED is less than approximately two thirds, and more preferably less than approximately one half, that of an LED on sapphire so that it is cool to touch during operation. The device is preferably integrated into an electronic system such as an LED-based luminaire, a light emitting strip, a light emitting sheet, an optical display, or a MicroLED display.

The device preferably comprises an epitaxial hexagonal crystal layer and a layer of a cubic material having a <111> out of plane orientation and having an in-plane crystalline texture with a full width half maximum (FWHM) less than or equal to approximately 15°. The epitaxial hexagonal crystal layer preferably comprises a group III-nitride semiconductor, preferably GaN. The layer of cubic material has preferably been textured by ion beam-assisted deposition (IBAD) and is preferably selected from the group consisting of MgO, $CeO_2$, a bixbyite structure, $Sc_2O_3$, $Y_2O_3$, $Al_2O_3$, a fluorite structure, TiN, a rock salt structure, $CaF_2$, cubic $ZrO_2$, $HfO_2$, $ScO_x$, and $Mn_2O_3$. The epitaxial hexagonal crystal layer preferably comprises GaN and the substrate comprises molybdenum, tungsten, tantalum, alloys thereof, Mo—Cu, or TZM. The layer of cubic material preferably has an in-plane crystalline texture having a FWHM of less than or equal to approximately 12°, more preferably 5°. The device preferably comprises a base layer disposed between the substrate and the layer of cubic material, the base layer optionally comprising amorphous $Al_2O_3$, $Y_2O_3$, or $SiO_2$. The device also preferably comprises one or more epitaxial buffer layers disposed between the layer of cubic material and the epitaxial hexagonal crystal layer. The epitaxial buffer layers preferably each have a lattice parameter that successively provides a transition from the lattice parameter of the cubic material to the lattice parameter of the epitaxial hexagonal crystal layer. When the epitaxial hexagonal crystal layer comprises GaN the epitaxial buffer layers preferably comprise a layer of $Sc_2O_3$, a layer of Zr, and a layer of AlN.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the drawings:

FIG. 3 is an x-ray diffraction (XRD) (202) pole figure of an MgO film created on an IBAD-MgO film on metal tape.

FIGS. 4A and 4B are RHEED images of epi-CeO on IBAD-CeO, and epi-GaN on top of buffered IBAD-CeO, respectively.

FIG. 32A shows the outline of the patterned 300 μm square mesa structure. FIG. 32B shows the same device with light emitted upon application of 5 mA.

DETAILED DESCRIPTION OF EMBODIMENTS OF THE INVENTION

The present invention is related to an approach to scale up GaN production using ion-beam crystal alignment for epitaxial films. The process is sometimes called ion-beam assisted deposition (IBAD), but it really refers to texturing of films with IBAD. IBAD texturing can occur at different time scales or thicknesses of films, but preferably occurs right at initial film nucleation and coalescence, which is known as ion-texturing at nucleation (ITaN). It typically occurs in the first 5-10 nm of deposit and has been demonstrated to be extremely fast, can occur in less than 1 second of deposition time. IBAD texturing can be performed on a large-area substrate that is typically a flexible metal foil. IBAD texture formation can alternatively be performed on flexible glass, ceramic, plastic or polymer. The process is easily scalable to long lengths with flexible substrates that can be put onto a spool suitable for roll-to-roll processing. The substrate itself can be polycrystalline but is preferably chosen for its mechanical as well thermal properties. Thus the material and the thickness of the foil are preferably optimized for the final application. Thin foils are preferably flexible and ductile. Additionally, since MOCVD growth (when utilized) is performed at high temperature, the material preferably has a good match to the coefficient of thermal expansion (CTE) of the thick GaN layers that will subsequently be deposited. For GaN molybdenum or tungsten or alloys thereof are preferably used. By eliminating the need for lattice matching in the substrate a greater variety of substrates may be chosen.

Figure 1:
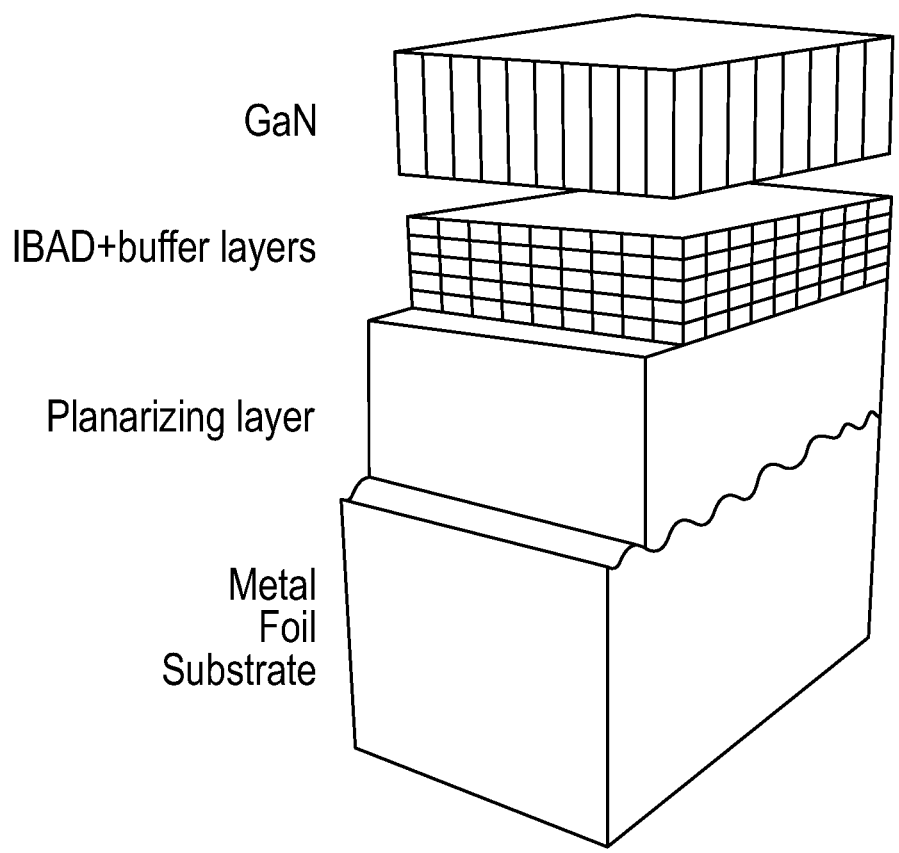
FIG. 1 is a schematic diagram showing an epitaxial GaN layer on top of an IBAD-textured layer and intermediate epitaxial buffer layers. The IBAD layer is prepared on a smooth surface that is obtained by planarizing a metal substrate, for example a metal foil.

Embodiments of the present invention are based on a novel GaN growth process which, compared to existing methods reported for GaN growth, comprises the use of non-single crystal substrates such as polycrystalline commercial metal foils or amorphous glass, upon which epitaxial GaN films are deposited directly and can be used for various applications including electronics, optics and optoelectronics, etc. In some embodiments, several different uniform films of thicknesses in the range of tens of nm are preferably evaporated or sputtered onto biaxially textured layers that are generated by an IBAD process. Amorphous wafers (amorphous materials such as glass, or a single-crystal wafer coated by a vacuum deposited amorphous thin film) or polycrystalline metal substrates, for example, can be used as flat substrates. For metal substrates it is preferable to utilize materials having a coefficient of thermal expansion closely matching that of GaN, for example elements such as molybdenum, tungsten, tantalum and alloys thereof. FIG. 1 is a schematic of an embodiment of the present invention.

Figure 22:
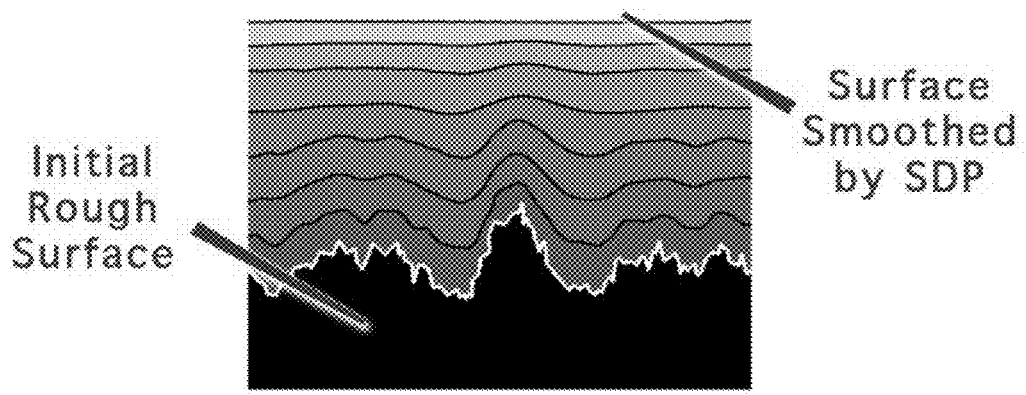
FIG. 22 is a schematic of the SDP process for planarizing a substrate.
Figure 23:
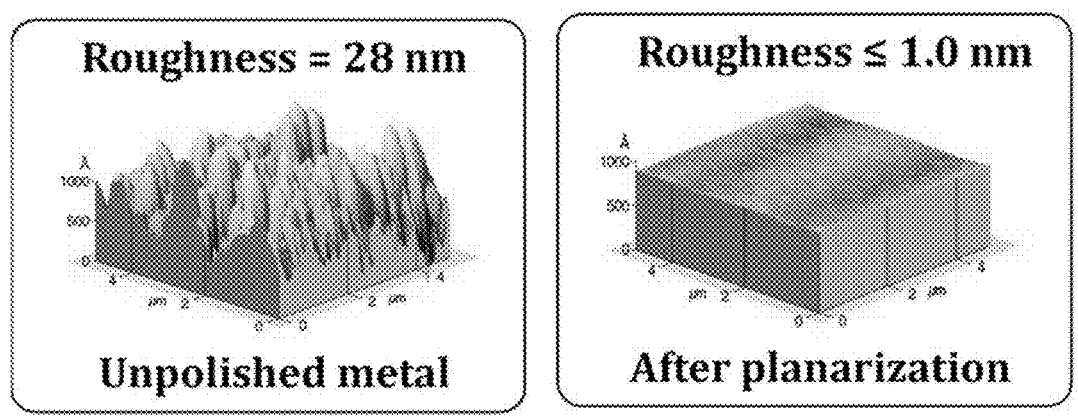
FIG. 23 shows experimental results of planarization.

The process of putting GaN on metal typically comprises three steps: 1) SDP, 2) IBAD+buffer layers, and 3) MOCVD GaN. The first step is solution deposition planarization (SDP). It is essentially chemical solution deposition (CSD) that has been optimized to smooth, or level, the surface by multiple coatings. In practice an initial root mean square (RMS) roughness of 20-100 nm on 5×5 μm scale can be reduced to about 0.5 nm after 10-30 coatings. A schematic and results of the SDP process are shown in FIGS. 22 and 23. SDP prepares the substrate for the IBAD texturing process, especially for ITaN, for which only a thin deposit is needed. ITaN typically requires a very smooth surface, i.e. less than 2 nm RMS roughness, and the smoother texture the better. In addition to smoothing the substrate, SDP can be adjusted to additionally provide an appropriate base layer material on which the IBAD layer is deposited. ITaN, in particular, requires appropriate chemistry in the base layer for the ion texturing to work. SDP is typically not required if the substrate is sufficiently smooth.

Figure 24:
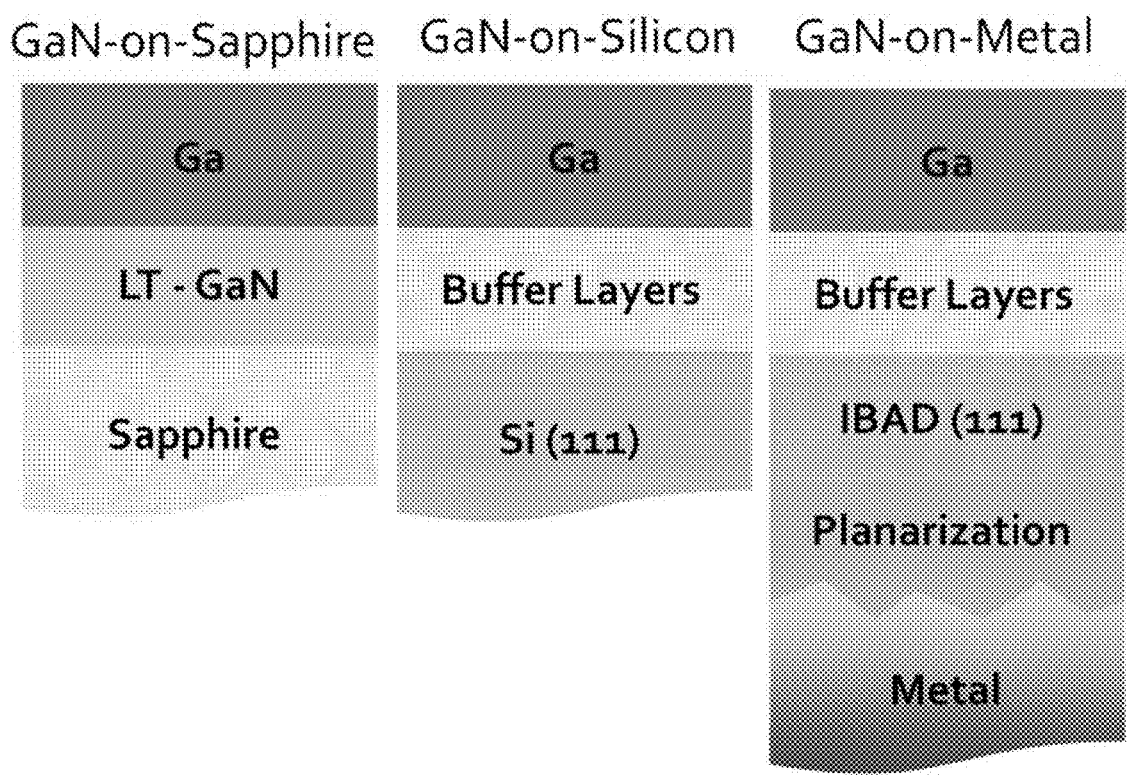
FIG. 24 is a comparison of epitaxial structures for GaN on sapphire, Si, and IBAD <111>.

In past decades a number of ITaN materials have been explored, but most work was focused on MgO. IBAD-MgO produces <100> out of plane orientation and that is suitable for depositing cubic materials on top with the same orientation. However, for deposition of hexagonally symmetric materials, such as wurtzite GaN, it can produce two epitaxial domains that are 30° rotated with respect to one another. In order to go from a cubic material to a hexagonal structure one would need a <111> orientation, as shown in FIG. 24. This is commonly done today in growing GaN on Si, where one uses a <111> oriented Si substrate. The quality of <111> IBAD in terms of the full width half maximum (FWHM) of the in-plane orientation has not been good enough to grow GaN, and not nearly as good as IBAD-MgO. IBAD-MgO has been reported down to 1.5° FWHM, with homoepi layers. The best <111> with $CaF_2$ obtained has been about 15°. One embodiment of the present invention uses $CeO_2$ with a FWHM in-plane orientation of about 8°. However, by growing GaN using MOCVD, that improved to less than 1° in the GaN layer. The way that GaN grows by MOCVD, starting with small seeds that coalesce and grow into large grains, accommodates an IBAD structure with poorer texture and still achieves high quality materials. Thus other IBAD materials, such as bixbyite structures, may be used.

The IBAD layer can in principle be chosen to lattice match the functional epitaxial layer, e.g. GaN. In order to come closer to the GaN lattice an epitaxial buffer layer can be deposited that transitions from the 3.826 Å lattice parameter of $CeO_2$ to 3.189 Å of GaN. Many materials with intermediate lattice parameters can be used. In one embodiment, $Sc_2O_3$ and Zr are used as two intermediate layers that will transition to AlN. A sputtered AlN surface is then used as a seed layer for GaN growth. That complete structure, called the IBAD template, can then be used as a template for epitaxial GaN growth. MOCVD GaN is grown directly on AlN or on GaN deposited by physical vapor deposition (PVD) on the IBAD template.

In one embodiment a substrate comprises a metal foil, preferably having a CTE matched to the desired functional semiconductor material. Deposited on the substrate is a base layer to enable IBAD. This layer can also be used to planarize the substrate and act as a diffusion barrier. Next is deposited an IBAD textured layer, then one or more intermediate buffer layer(s). The final layer is a hexagonal material, preferably a semiconductor material such as III-N or ZnO. The substrate is preferably chosen to match the functional layer or semiconductor layer coefficient of thermal expansion as closely as possible. The IBAD layer is preferably chosen to match the lattice constant of the semiconductor layer as closely as possible. This enables the decoupling of matching the two properties in selecting the substrate. In a conventional single-crystal substrate one has to use the materials that have a good enough lattice match and cannot independently adjust other properties.

For substrates used for IBAD texturing, a substrate with desired mechanical properties, such as flexibility and thermal properties such as CTE (coefficient of thermal expansion) can be selected, and then the IBAD layer with the desired lattice constant can be chosen independently. Furthermore, a large area substrate, not one that is limited to single-crystal boule sizes, can be used, enabling production to be scaled to extremely large areas, and enabling production of integrated devices over those large areas via printing, for example. Roll-to-roll (R2R) is a method to scale production to very large areas (in small volumes), but it can also be scaled up sheet-to-sheet (S2S). Also, the substrate and IBAD layer can have different orientations, lattice mismatches, etc., greatly increasing the versatility of the present invention.

One embodiment of the present invention comprises a single-crystal-like hexagonal-structure material, epitaxially deposited on an ion-beam-assist deposit (IBAD) textured layer. Epitaxial intermediate buffer layers between the IBAD layer and the hexagonal-structure material may optionally be deposited. The hexagonal-structure material optionally comprises graphene, $MoS_2$, $WS_2$, or another two dimensional material, or GaN, AlN, InGaN, or another III-N material. The IBAD layer material preferably comprises a cubic structure in the (111) orientation giving a 3-fold symmetry for alignment of the hexagonal materials on top, such as fluorite or bixbyite structure materials.

Another embodiment of the present invention is ion-beam alignment of a film of a bixbyite-structure material, i.e. structure of $(Mn-Fe)_2O_3$, such as $Sc_2O_3$ or $Y_2O_3$, on top with a (111) orientation out of plane and in-plane orientation, preferably with in-plane orientation better than 15°, and more preferably with in-plane orientation better than 10°.

Embodiments of the present invention comprise a CTE-matched metal substrate for IBAD obtained by alloying the metal to get perfect matching to the semiconductor, such as in the Mo—Cu alloy system.

Embodiments of the present invention comprise base (or planarization) layers for IBAD flourites or bixbyites that include amorphous-$Al_2O_3$, $Y_2O_3$, $SiO_x$; these layers can be deposited by chemical solution deposition in manner that produces planarization (e.g. SDP).

Embodiments of the present invention comprise integration of active devices fabricated using epitaxial III-N materials on IBAD substrates, such as metal foils with a textured layer. Devices are printed using several different possible printing technologies, e.g. screen printing or inkjet printing, patterned and contacts and passive devices are preferably printed on top afterwards. A display can be manufactured using this printing of LED devices on IBAD substrates. Power devices integrated with LEDs can provide constant power, switching, or dimming control of LED devices, or different colors and different color temperatures.

Embodiments of the present invention are novel methods for GaN growth on non-single-crystal substrates with the use of an IBAD template (4-fold symmetric and 3-fold symmetric IBAD) that can be applied to almost any substrate that can sustain the GaN growth temperature, in the case of MOCVD above 1000° C., such as metals, ceramics or glass (quartz). Other methods for deposition of GaN-based devices are reactive evaporation (esp. MBE) and reactive sputtering. The latter methods utilize a lower temperature during deposition and growth and hence are more amenable to non-standard substrates that are not single-crystal wafers, such as plastics and glass. Matching the coefficient of thermal expansion (CTE) enables metals to be used ideally as substrates for GaN growth. These metals include, for example, molybdenum, tantalum, tungsten and alloys of these elements with other elements, such as TZM, an alloy of molybdenum and small amounts of titanium and zirconium, or molybdenum-copper alloys. These alloys exhibit a high thermal conductivity which is useful for devices requiring conductive cooling such as GaN power electronics.

Embodiment substrates for growth of epitaxial films of group-III nitride formed by ion-beam textured layers with epitaxial overlayers comprise IBAD biaxially textured layers comprising IBAD-MgO, TiN, or other rock-salt structured materials, previously known to be amenable to ion-beam biaxial texturing, but also IBAD-$CeO_2$ (cerium dioxide) or other fluorite structure materials such as $CaF_2$, cubic $ZrO_2$, or $HfO_2$, which form a (111) orientation during IBAD. Other materials include IBAD-$ScO_x$ (with the $Sc_2O_3$ structure) and other oxides or nitrides in the bixbyite structure, such as $Y_2O_3$ or $Mn_2O_3$, bixbyite being a vacancy ordered derivative of the fluorite structure; epitaxial overlayers (buffer layers) lattice matched for growth of GaN or other group III nitride compounds, such as AlN or other nitrides, or elemental metal layers such as Zr or Hf, or oxides such as cubic $Al_2O_3$. A single-crystal-like cubic film with a (111) orientation on an arbitrary surface can be manufactured for growth of epitaxial III-N, or other hexagonal structure semiconductor or semi-metal such as InP (111), transition metal dichalogenides, and Indium Gallium Zinc Oxide (IGZO), layers using ion beam textured layers. These same textured layers can be obtained by other means besides IBAD such as inclined substrate evaporation or inclined sputtering. III-N layers can be grown by MOCVD, MBE, reactive evaporation, reactive sputtering, or other methods. A metal substrate may be used to produce III-N layers on a flexible metal foil or other metal substrate by use of an ion beam textured layer; metal substrates include materials such as molybdenum, tantalum, tungsten and alloy of these elements with other elements. III-N layers may be grown on a glass substrate with an intermediate ion beam assisted deposition (IBAD) textured layer. An electronic or optoelectronic device can be manufactured that comprises the epitaxial III-N material on an IBAD template substrate; such a device includes MOSFET's, MESFETs, HEMTs, Heterojunction FETs, heterojunction bipolar transistors (HBTs), thin-film transistors, sensors, memristors, light emitting diodes (LEDs), laser diodes (LD), SAW devices, spintronic devices, photodetectors, photovoltaic (PV) diodes. Furthermore these devices can be used in products such as LED-based displays, LED-based lighting products, PV cells and modules.

Some embodiments of the present invention are a process for making an aligned layer on top of a metal to manufacture an LED; an LED structure made on top of an ion-aligned layer; a metal/amorphous planarizing layer/(111) textured layer/hexagonal semiconductor layer structure; IBAD texturing of Bixbyite materials; base layers deposited on a flexible substrate for IBAD layers, such as amorphous $Al_2O_3$, $Y_2O_3$, or $SiO_2$; a GaN PVD layer used as a nucleation layer for MOCVD GaN; and a metal alloy substrate to match the CTE of GaN very closely, such as Mo—Cu alloy.

The IBAD texture has been improved in embodiments of the present invention to below 10°, and the use of additional buffer layers and a high temperature MOCVD process for GaN growth produces GaN of much higher quality, <1° in-plane FWHM (as opposed to >10°) and less than 0.5° out-of-plane (as opposed to <1.5°) that enables the manufacture of high quality devices. The way that epitaxial GaN grows in embodiments of the present process is fundamentally different from epitaxial growth of Si and other semiconductors. This means that active devices such as a light-emitting diode (LED) consisting of III-N materials (such as InGaN) fabricated on a (111) ion-beam-assist deposit (IBAD) textured layer can be fabricated.

Example 1

To demonstrate the applicability of IBAD templates for epitaxial growth of GaN and related group III nitride materials, MOCVD growth of GaN, also known as MOVPE (metal-organic vapor phase epitaxy), was performed. Samples were briefly heated to 800-1000° C. in flowing $H_2$ prior to growth. The GaN nucleation layer was grown using trimethylgallium (TMGa) and ammonia ($NH_3$) using $H_2$ and $N_2$ push flows at a substrate temperature of 530° C. After the growth of the GaN NL, the TMGa was turned off and the wafers were ramped in temperature to 1050° C. over 8 minutes. At 1050° C. the TMGa was turned on for 1 hour resulting in ≤2 μm of GaN film. After growth the wafers were cooled in the $NH_3$, $H_2$, and $N_2$ flows and removed from the growth reactor.

Figures 2A, 2B:
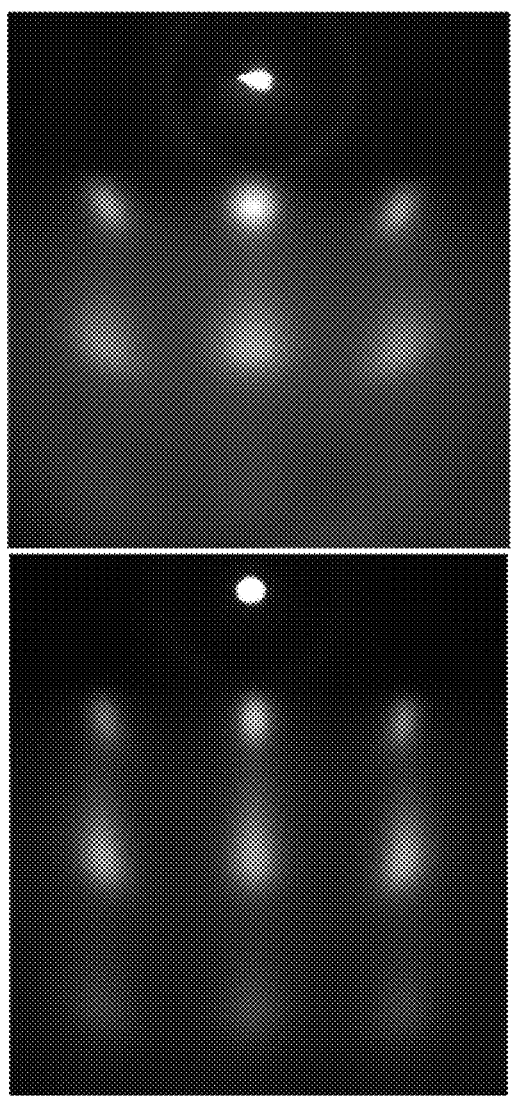
FIGS. 2A and 2B are Reflection High-Energy Electron Diffraction (RHEED) images of IBAD-MgO and homo-epi MgO layers, respectively.
Figure 31:
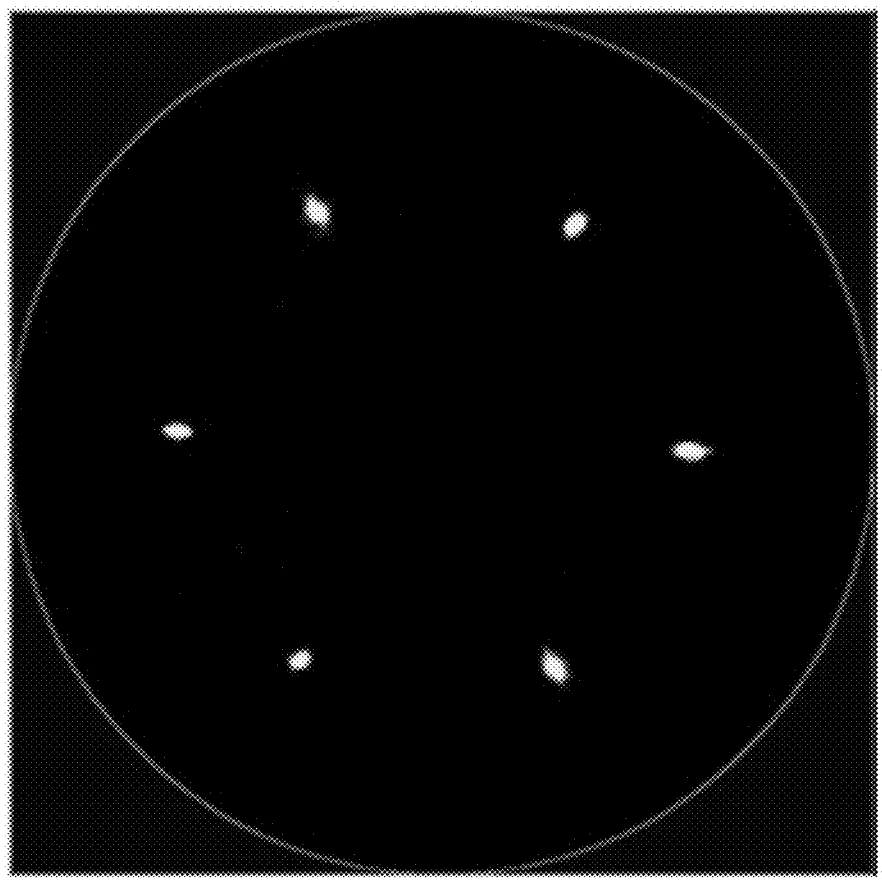
FIG. 31 is an XRD (101) pole figure of a 5 micrometer thick epitaxial GaN layer grown by the MOCVD process.
Figure 32A:
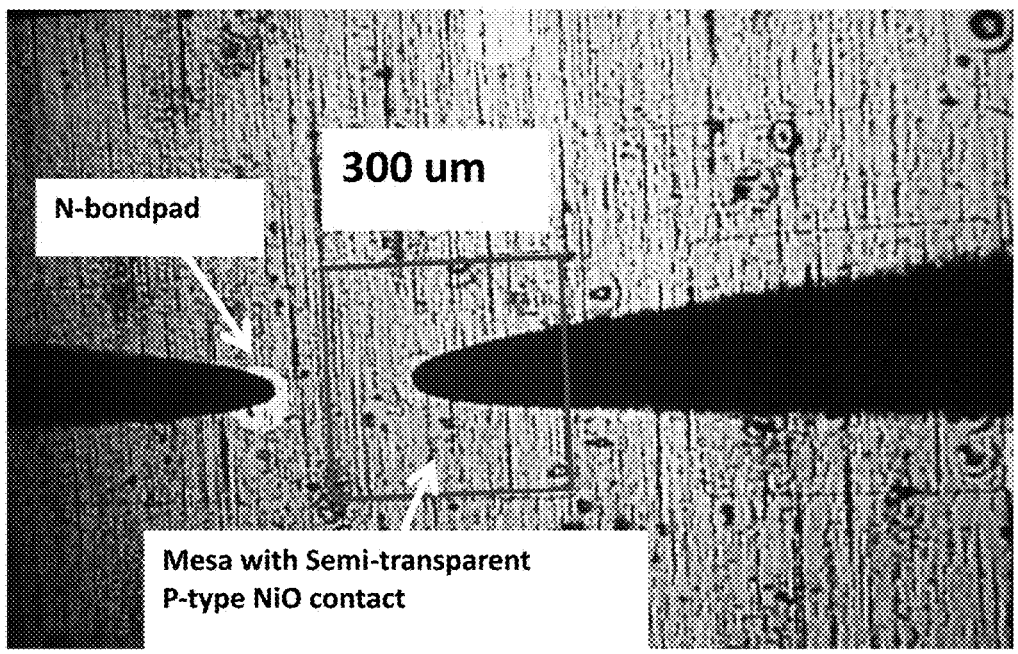
FIGS. 32A and 32B show an LED structure patterned on a LED GaN-on-metal device such as that shown in FIGS. 25-26.
Figure 32B:
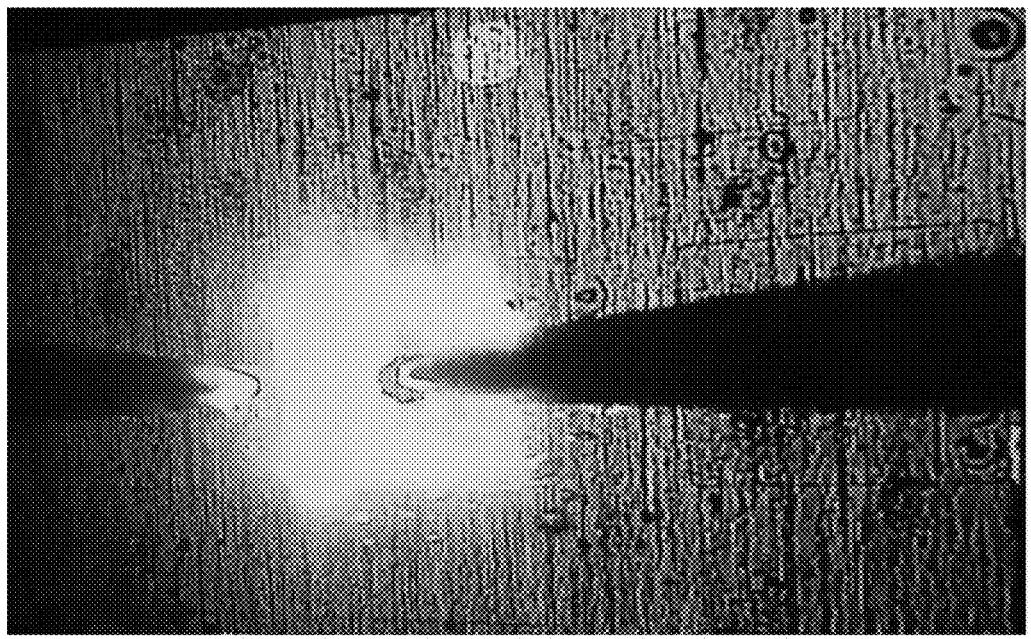
Figure 32C:
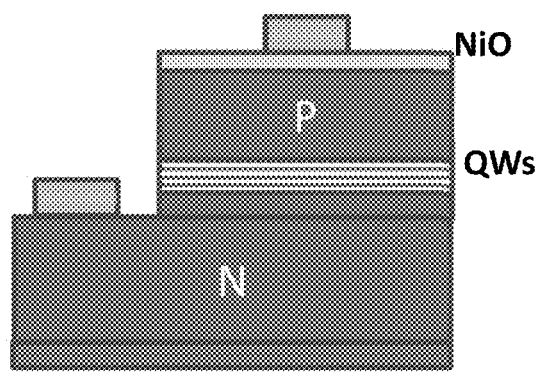
FIG. 32C shows a side-view schematic of the patterned structure shown in FIGS. 32A and 32B.

For the templates for GaN growth, substrates were prepared separately prior to GaN growth. In one embodiment we utilized IBAD-textured MgO films. These films are oriented with the (100) axis out of the plane and form a square, 4-fold symmetric lattice on the surface. IBAD-MgO films were first deposited on amorphous $Y_2O_3$ surfaces, the base layer for IBAD texturing. For good texturing of MgO during the ion beam assisted deposition (IBAD) it is important to have a smooth surface, which was obtained by sequential chemical solution deposition of $Y_2O_3$ or $Al_2O_3$ using acetate precursors dissolved in methanol. This process is called solution deposition planarization or SDP, and can produce surfaces as smooth as 0.5 nm RMS roughness when starting with a 50 nm RMS roughness metal foil substrate. The substrate was then placed in the vacuum deposition system where MgO is deposited at a rate of about 3-5 Å/s and an Ar ion beam incident at 45° and with an ion energy of 700-1000 eV. Deposition typically takes about 10-30 seconds. Following IBAD a 50 nm thick film of homoepitaxial MgO was deposited in the vacuum chamber by evaporation at a substrate temperature of 400-700° C. During the IBAD process as well as homoepitaxial deposition, film growth was monitored by Reflection High Energy Electron Diffraction (RHEED) to verify the crystalline alignment of the film. FIG. 2 shows RHEED images of the MgO film after IBAD and after homoepitaxial MgO. FIG. 3 shows an x-ray pole figure of the (202) peak demonstrating high degree of in-plane alignment. FIG. 31 shows an XRD (101) pole figure of MOCVD-grown GaN.

In a second embodiment of the IBAD template, we utilized IBAD-textured $CeO_2$ textured films. These IBAD films are oriented with the (111) axis out of the plane and form a 3-fold symmetric lattice on the surface, suitable for growth of hexagonal structure materials such as wurtzite GaN, hexagonally close packed (hcp) metals, or other 3-fold symmetric (111) buffer layers. IBAD-$CeO_x$ films were grown on amorphous $Al_2O_3$ surfaces, the base layer for IBAD $CeO_x$. Other amorphous layers such as $SiO_x$ and $Y_2O_3$ are also suitable for IBAD-$CeO_x$. Just as for MgO, to obtain the best texturing it is important to have a smooth surface, which was produced by sequential chemical solution deposition planarization (SDP) of $Y_2O_3$ or $Al_2O_3$. With multiple coatings surfaces as smooth as 0.5 nm RMS roughness when starting with a 50 nm RMS roughness metal foil substrate can be achieved. The substrate was then placed in the vacuum deposition system where $CeO_2$ was deposited at a rate of about 3-5 Å/s by electron-beam evaporation and with an Ar ion beam incident at 45° and with an ion energy of 700-1000 eV. Deposition typically took about 10-30 seconds. Following IBAD a 50 nm thick film of homoepitaxial $CeO_2$ was deposited in the vacuum chamber by evaporation. During the IBAD process as well as homoepitaxial deposition, film growth was monitored by Reflection High Energy Electron Diffraction (RHEED) to verify the crystalline alignment of the film. FIG. 4 shows RHEED images of the $CeO_x$ film after IBAD and after homoepitaxial $CeO_x$.

Several different epitaxial buffer layers were deposited on IBAD-textured substrates by evaporation in vacuum. Although growth of epitaxial GaN on $CeO_2$ is challenging due to the large lattice mismatch of the two crystalline lattices (GaN has a 16.7% smaller lattice constant than $CeO_2$ (111)), by providing suitable intermediate buffer layers one can transition or step-grade to a lattice match close to GaN. These intermediate buffer layers consisted of (111) metal oxides (such as $ZrO_2$, $Sc_2O_3$, $Y_2O_3$), hexagonally close packed metals (such as Zr, Hf, Ti, Sc, etc.), and wurtzite or (111) metal nitrides (such as AlN, ZrN, TiN, etc.) During deposition of epitaxial buffer layers, film growth was also monitored by RHEED to verify the crystalline alignment. FIG. 4B shows a RHEED image of epitaxial GaN grown on top of buffered IBAD. For MOCVD GaN growth, several intermediate epitaxial buffer layers comprising metal oxides, metal nitrides and elemental metals were used. For the IBAD-MgO template we successfully grew epitaxial GaN on $\gamma$-$Al_2O_3$ (cubic aluminum oxide) and SrN. For the IBAD-$CeO_x$ template GaN was grown successfully on epitaxial Hf and AlN.

Figure 5:
FIG. 5 is an XRD theta-2theta scan in GADDS area detector, showing the bright spot for GaN (002) reflection. The rings are from the underlying metal substrate.
Figure 6:
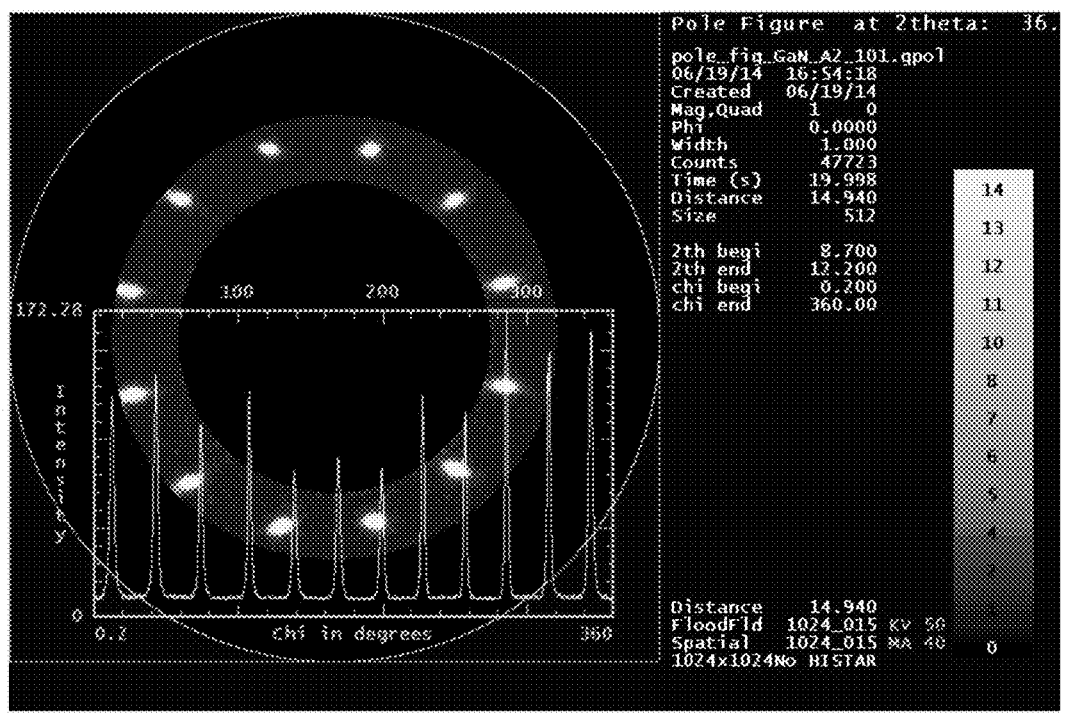
FIG. 6 is an XRD (101) pole figure for the GaN film on $\gamma$-$Al_2O_3$ buffered metal tape.
Figure 7:
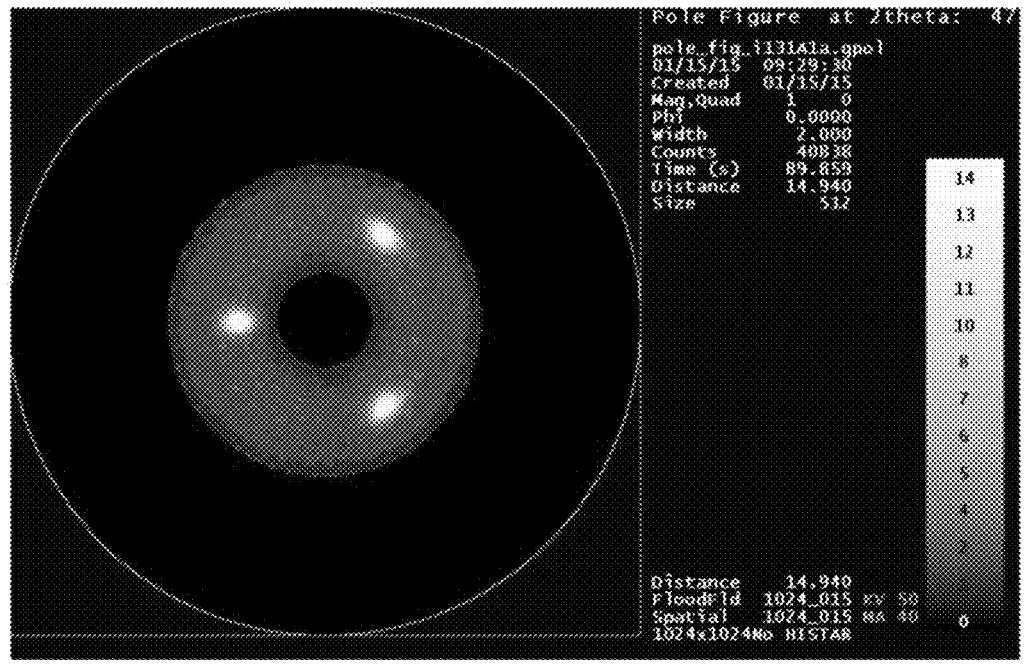
FIG. 7 is an x-ray diffraction pole figure of a $CeO_2$ film, (220) pole, created on an IBAD-CeO film on metal tape.
Figure 8:
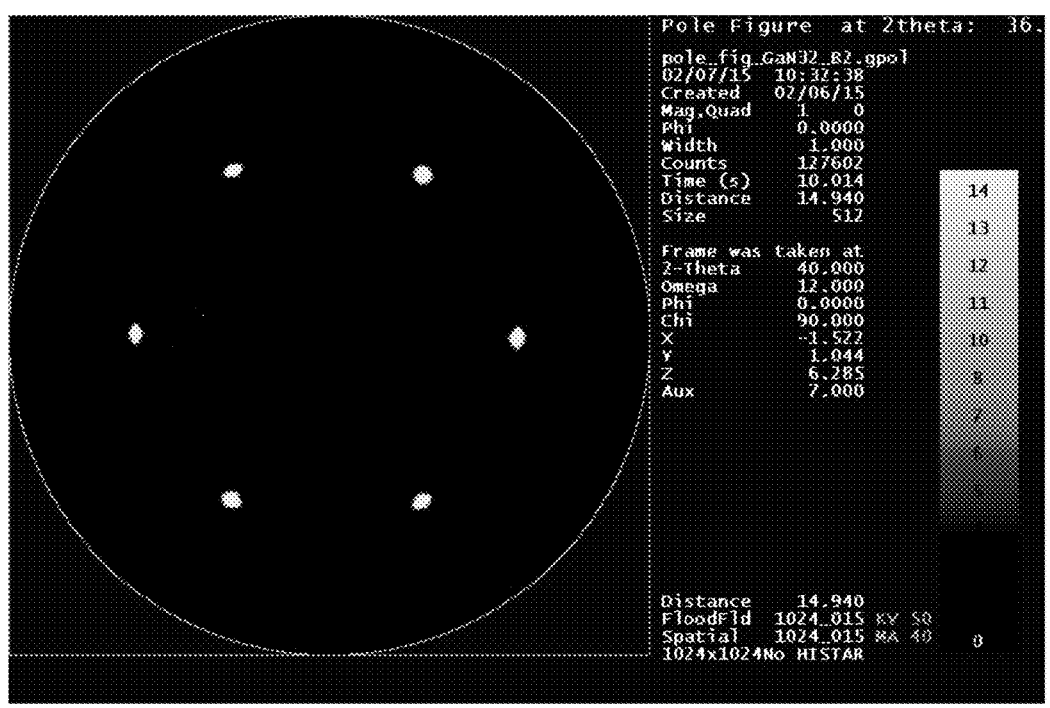
FIG. 8 is an x-ray diffraction (101) pole figure of a GaN film created on an IBAD-CeO film on metal tape.

FIG. 5 shows an x-ray diffraction GADDS 2D detector image that demonstrates a sharp GaN peak due to the single-crystal-like nature of the GaN film on top of the polycrystalline metal substrate. FIG. 6 shows the (101) pole figure for the GaN grown on the 4-fold symmetric IBAD. The resulting GaN has a 12-fold symmetric (101) pole figure. This is because there are 2 different symmetric orientations of the hexagon on a square lattice, resulting in two domains that are rotated with respect to each other by 30°. In contrast, GaN grows in a single domain on top of 3-fold symmetric IBAD such as (111) cube orientation. FIG. 7 shows a 3-fold symmetric IBAD pole figure and FIG. 8 shows 6-fold symmetric GaN on the 3-fold IBAD-CeO. The in-plane full width half maximum of this GaN layer is 1-2°. Out of plane rocking curve is 0.6-0.7° for GaN on IBAD/metal and 0.3° for IBAD/sapphire.

Figure 9A:
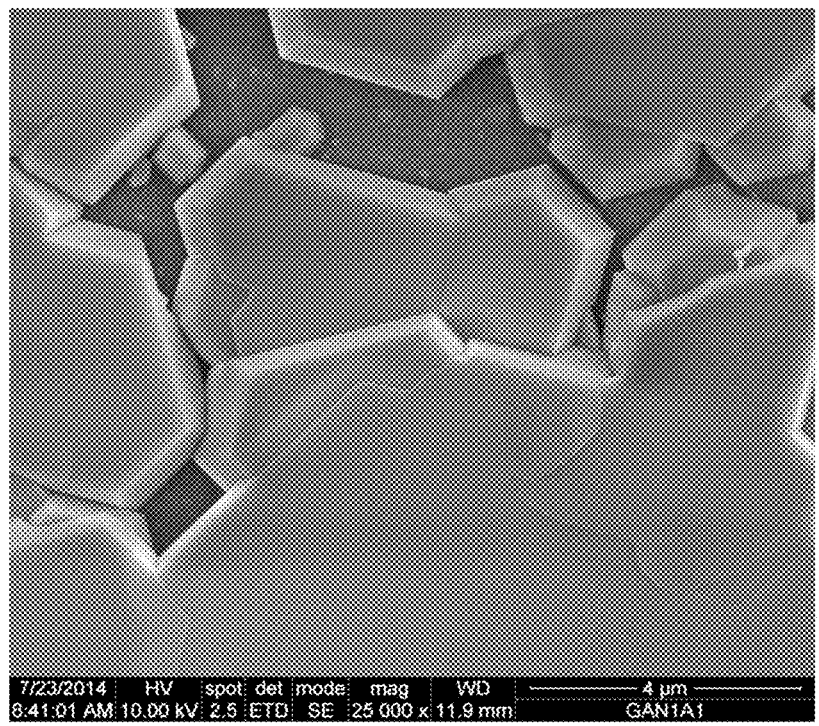
FIGS. 9A-9C are SEM images of epi-GaN films on IBAD/metal tape, showing a progression of island coalescence from FIG. 9A to FIG. 9C.
Figure 9B:
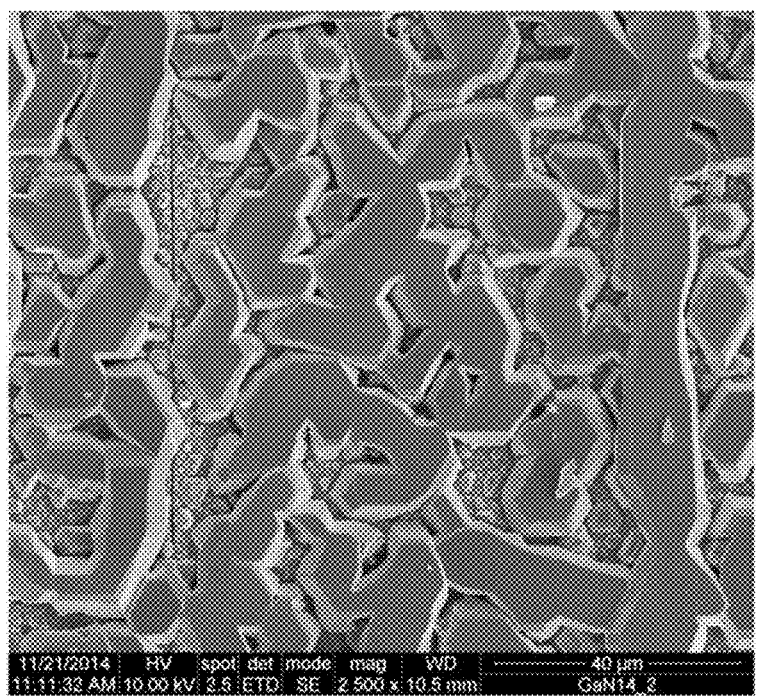
Figure 9C:
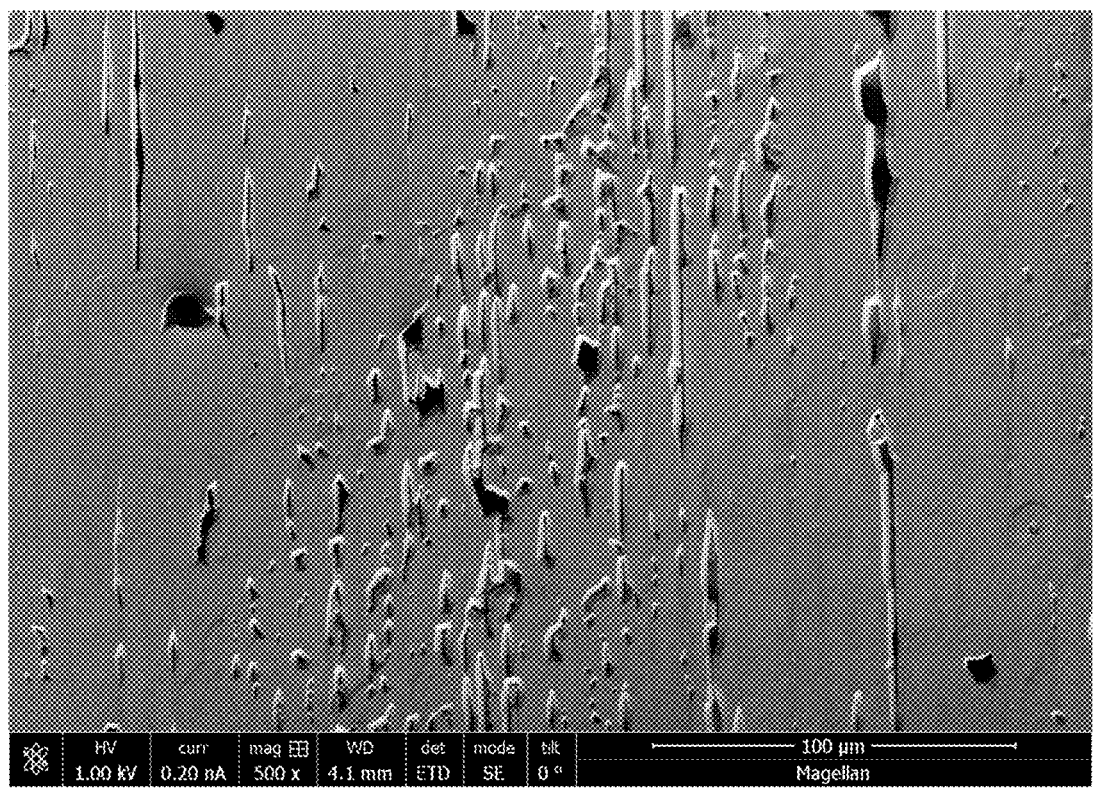
Figure 10A:
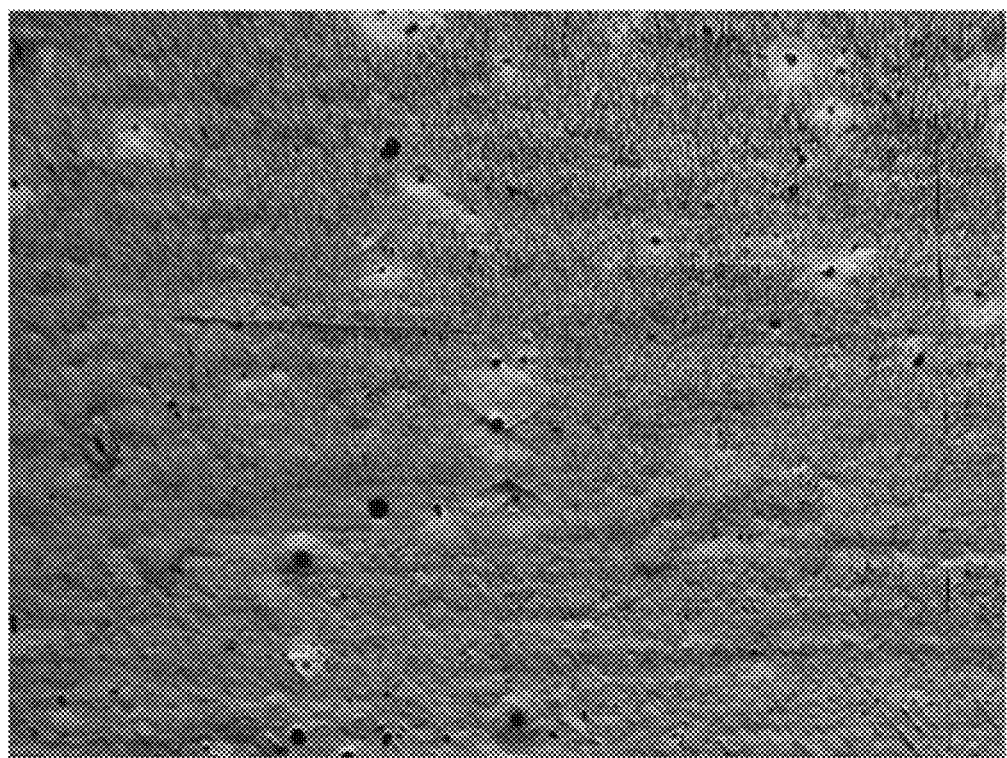
FIGS. 10A and 10B are optical images of GaN layers on the IBAD template on metal foil. Thin (approximately 100 nm) AlN (FIG. 10B) or AlN/GaN (FIG. 10A) were deposited by physical vapor deposition (PVD) and used as seed layers for MOCVD GaN growth.
Figure 10B:
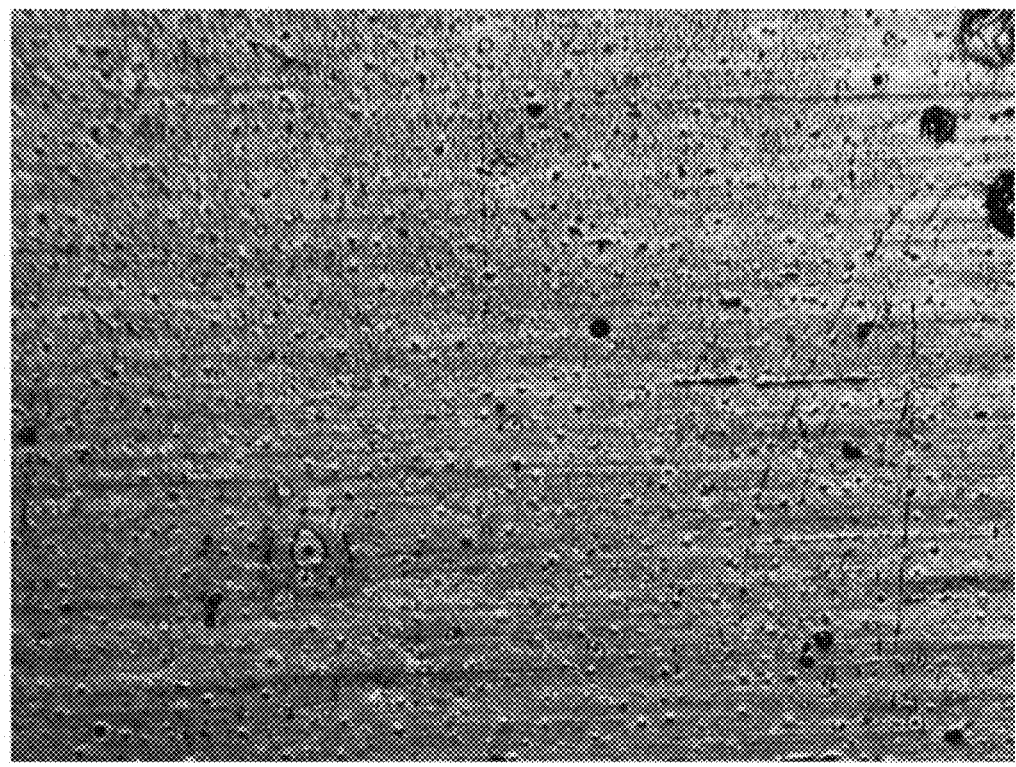
Figure 11:
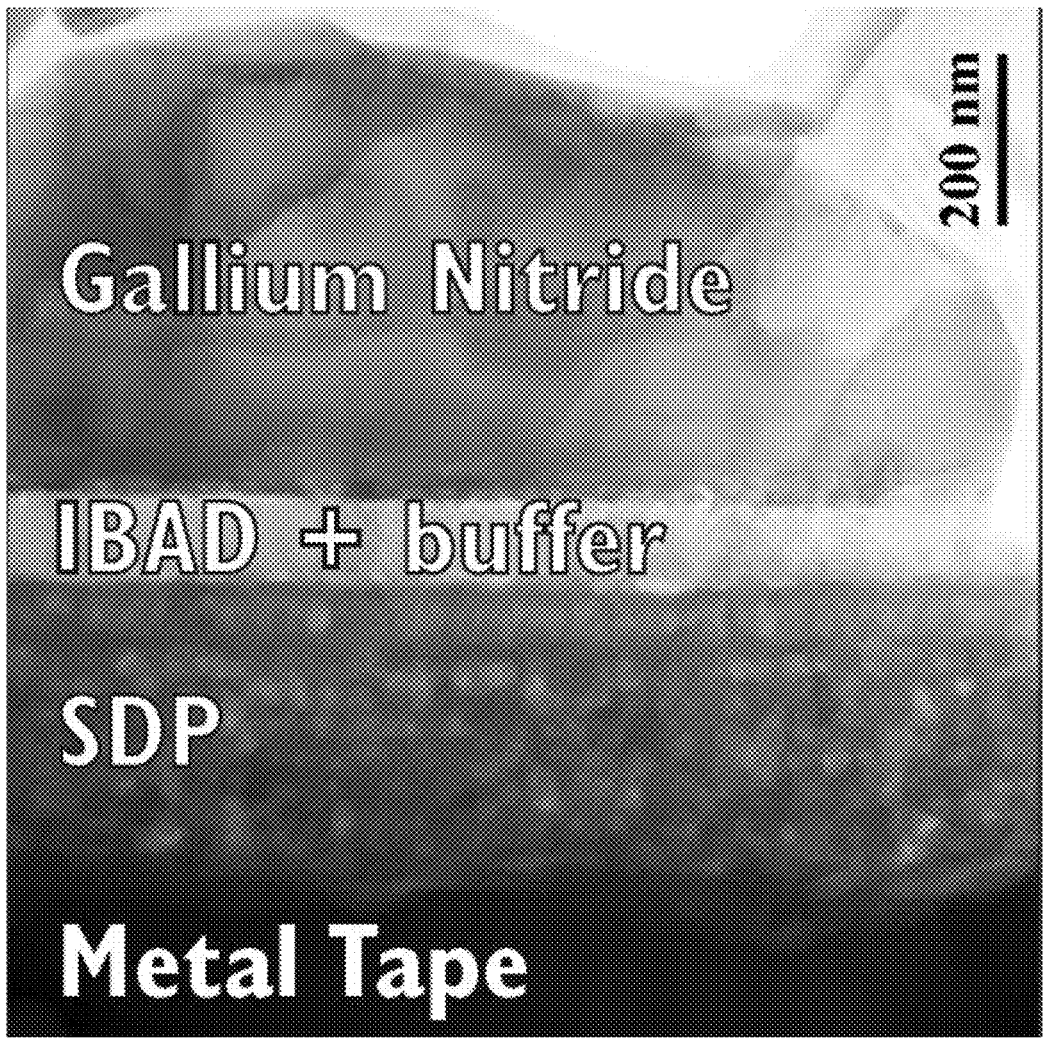
FIG. 11 is a TEM cross-section of an epi-GaN film on top of metal tape having a planarizing layer (SDP) and IBAD textured layer on top.

FIG. 9 shows several electron micrographs of epitaxial GaN layers on top of our 3-fold IBAD (111) template. This template includes a thin buffer layer (less than 50 nm) of either Hf or AlN. Although in this case the coverage of the GaN film is not complete due to incomplete coalescence of grains, we can see very smooth (atomically smooth) surfaces on the GaN mesa structures. FIG. 10 shows optical images of epitaxial GaN grown on a double buffer layer structure that includes an epitaxial metal, such as Zr or Hf, together with an AlN layer grown by pulsed dc sputtering. GaN has also been grown on the AlN by reactive evaporation in this manner. This has so far yielded the best coverage of the GaN layer by MOCVD. FIG. 11 shows a cross section of the film analyzed by transmission electron microscopy where one can see the robustness of the IBAD and intermediate layers, as well as the smoothing of the SDP layers. The epitaxial arrangement is preserved from the IBAD layer into the GaN layer.

Figure 12:
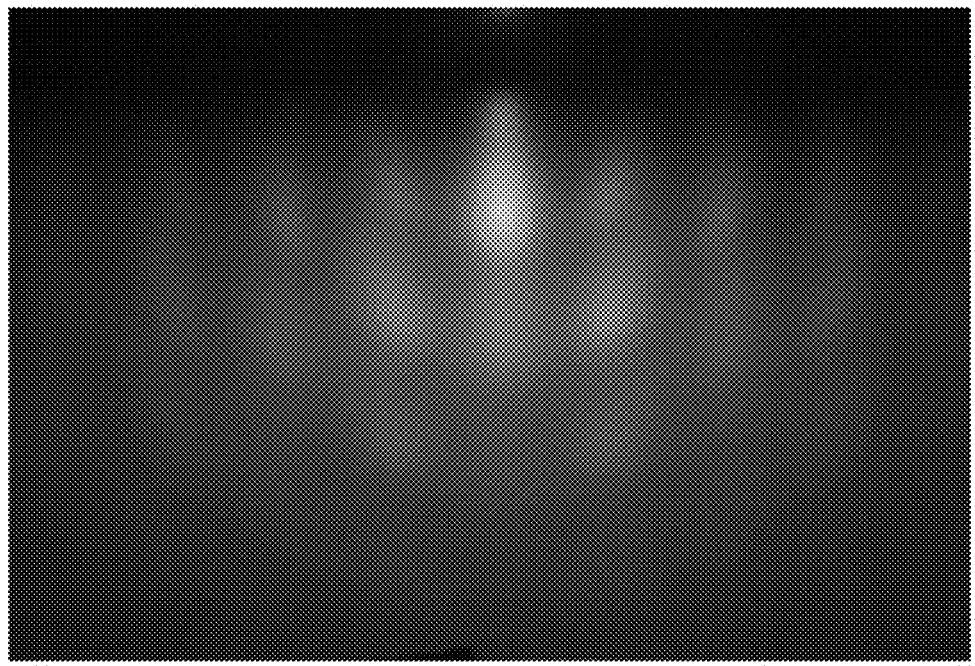
FIG. 12 is a RHEED image during IBAD deposition of cerium oxide (111).
Figure 13:
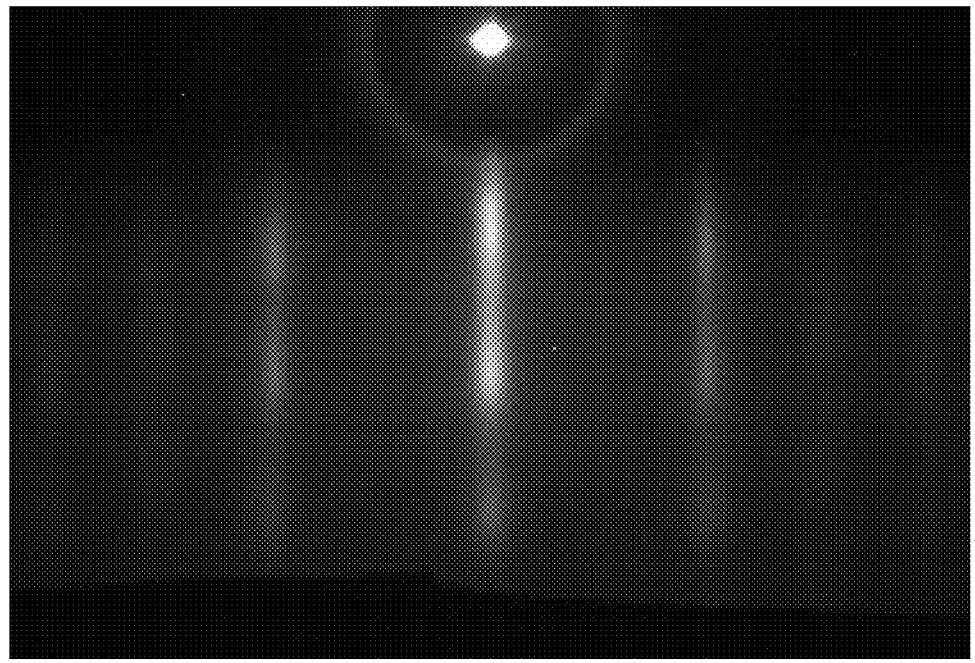
FIG. 13 is a RHEED image after deposition of homoepitaxial cerium oxide on IBAD-cerium oxide (111).
Figure 14:
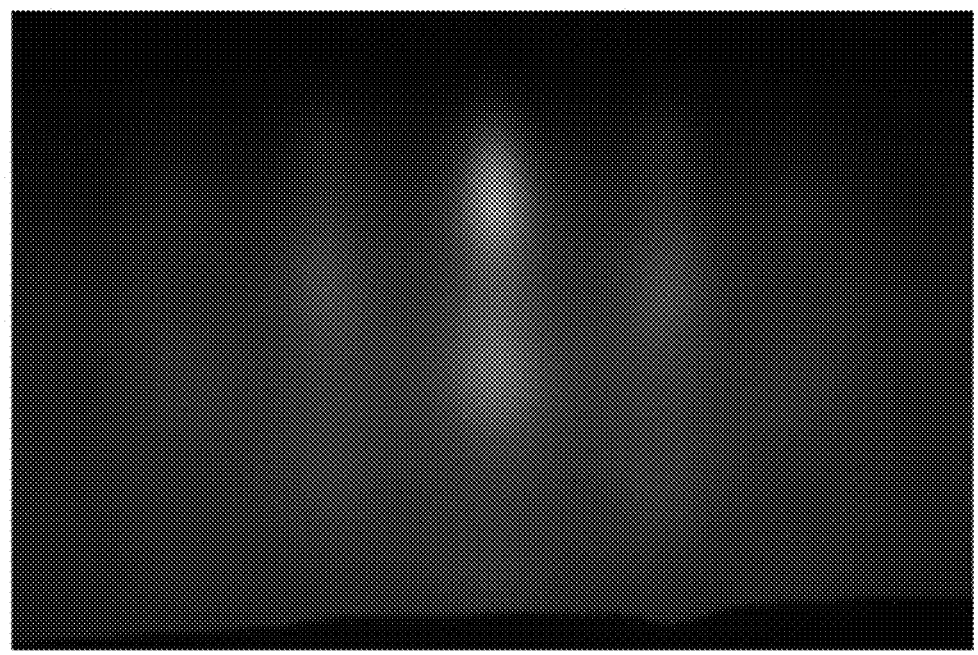
FIG. 14 is a RHEED image during IBAD deposition of scandium oxide (111).
Figure 17:
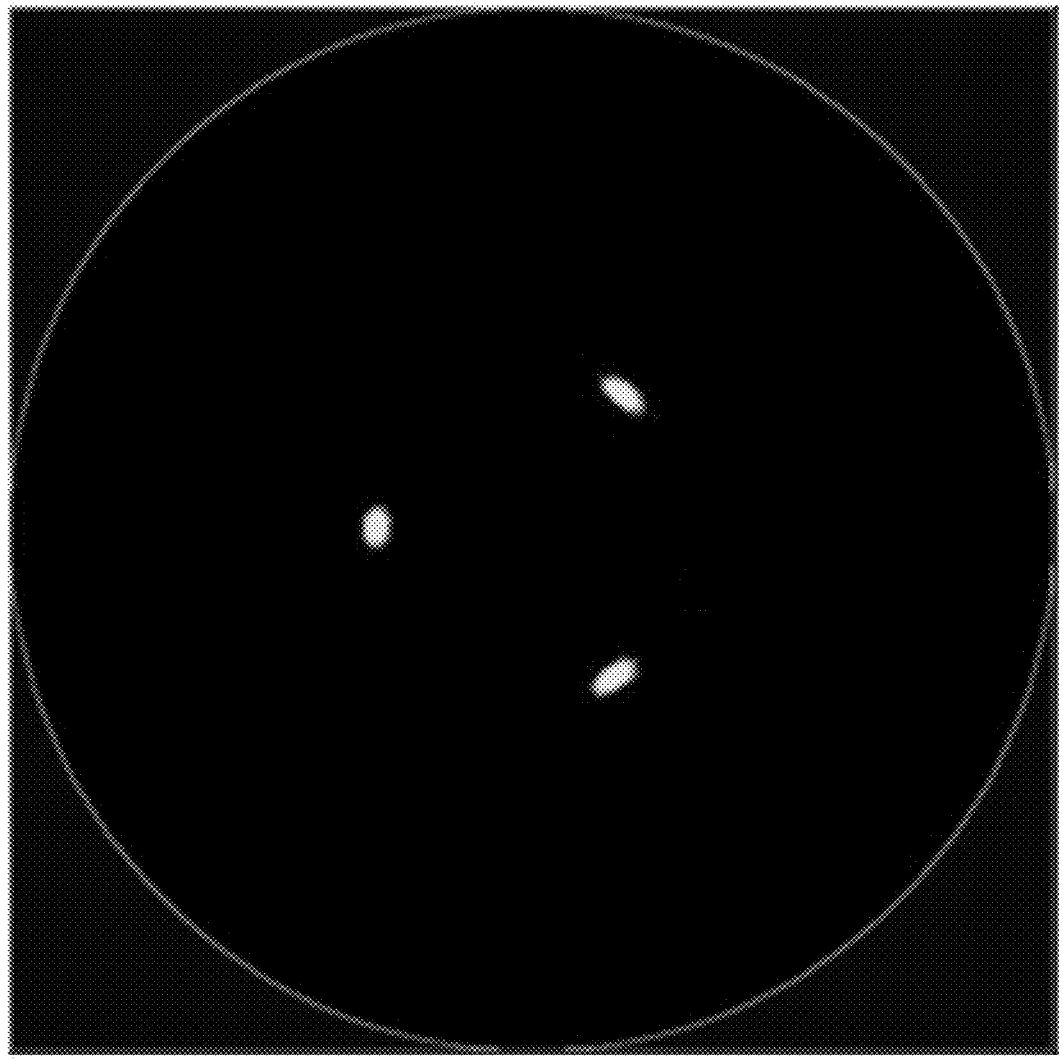
FIG. 17 shows an X-ray diffraction (XRD) (220) pole figure of a biaxially aligned $CeO_2$ film created on an IBAD-CeO film on metal tape. The ion beam is directed from the left.

FIGS. 12 and 13 show RHEED in situ images of IBAD-$CeO_2$ samples, immediately after IBAD deposition and following homoepitaxial $CeO_2$ on IBAD-$CeO_2$, respectively. The images indicate single crystalline orientation as well as in-plane alignment. FIG. 17 shows the in-plane alignment of the $CeO_2$ crystalline layer.

Figure 15:
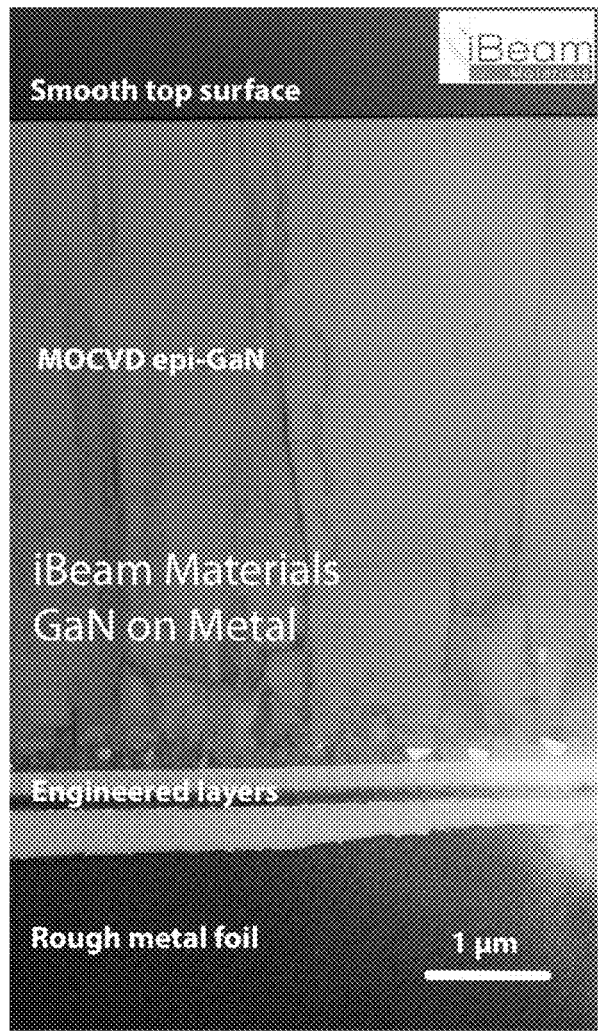
FIG. 15 is a cross-sectional TEM image of epi-GaN layer deposited on the IBAD template on a metal substrate.

FIG. 15 shows a cross-sectional TEM micrograph of the complete structure including the thick GaN layer. One can see, from bottom, the rough metal foil, the smoothing layers of the SDP planarization, followed by IBAD and subsequent epitaxial buffer layers. The very top surface is extremely smooth enabling planar and other device fabrication.

Figure 16:
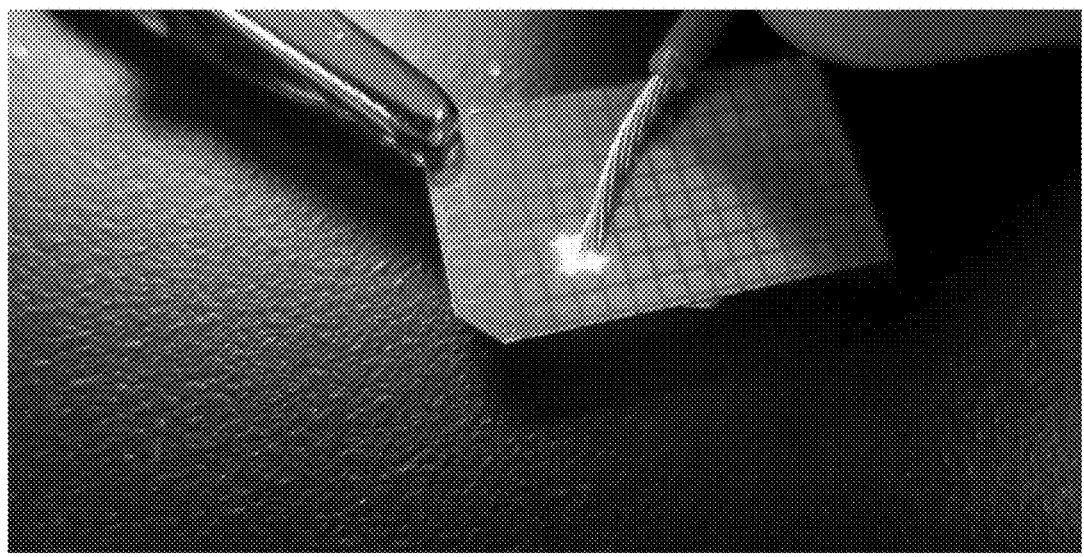
FIG. 16 shows LED luminescence from an LED structure deposited on an IBAD template on a flexible metal substrate.

FIG. 16 shows electroluminescence (EL) from an LED structure comprising an InGaN multi-quantum well structure and a p-doped GaN layer on top that was deposited epitaxially on top of the GaN film on the IBAD template on a metal foil.

Figure 18A:
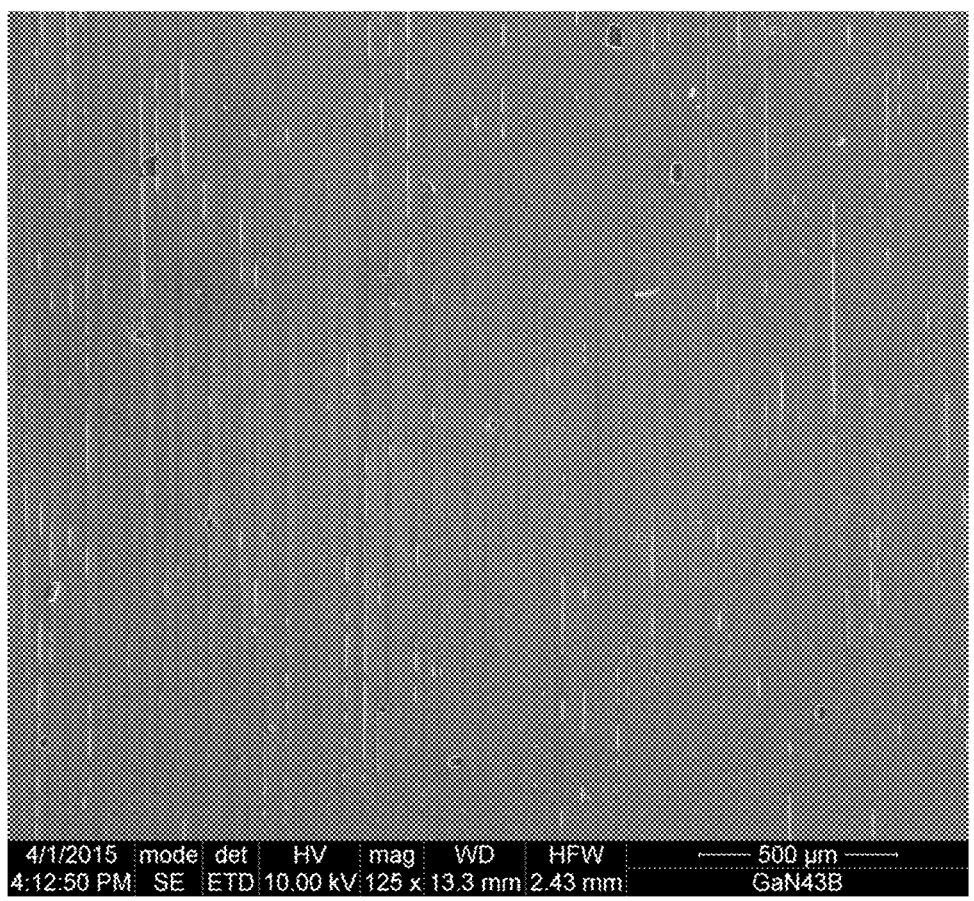
FIGS. 18A-18B are SEM images of epi-GaN films on IBAD/metal tape at different magnification.
Figure 18B:
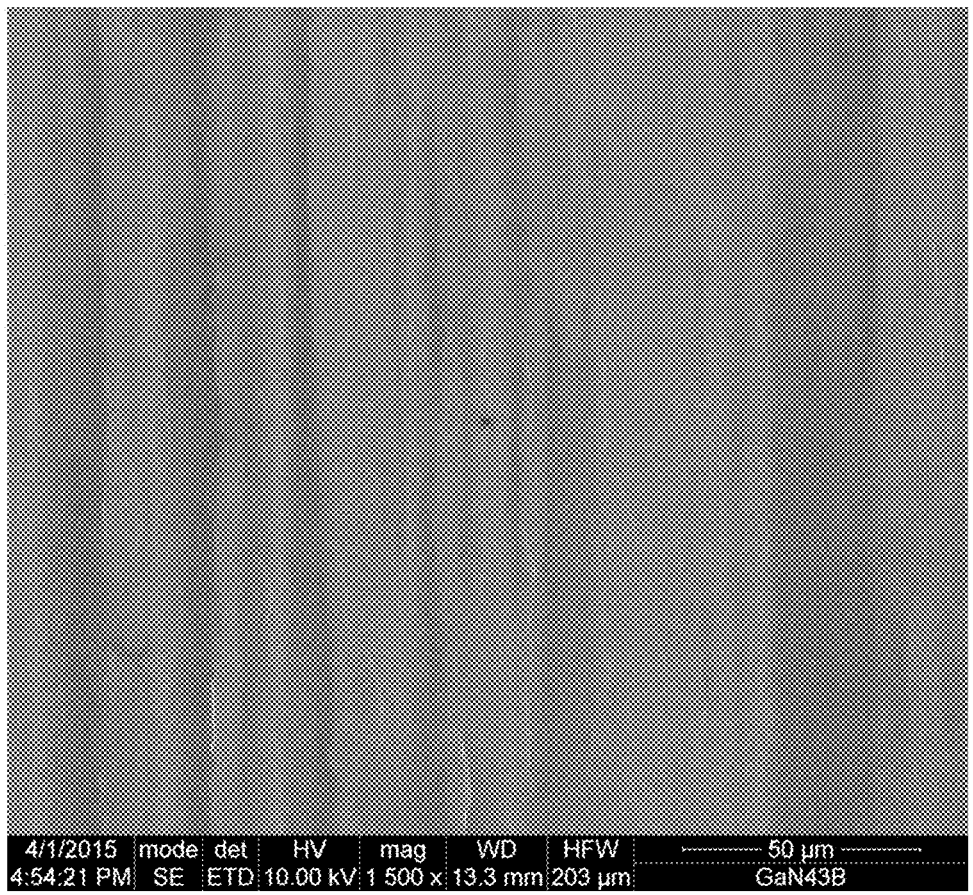

FIGS. 18A-B show SEM micrographs of thick (about 5 micron) GaN films. Typically there are some defects, but also areas that are smooth over 100 μm areas.

Figure 19A:
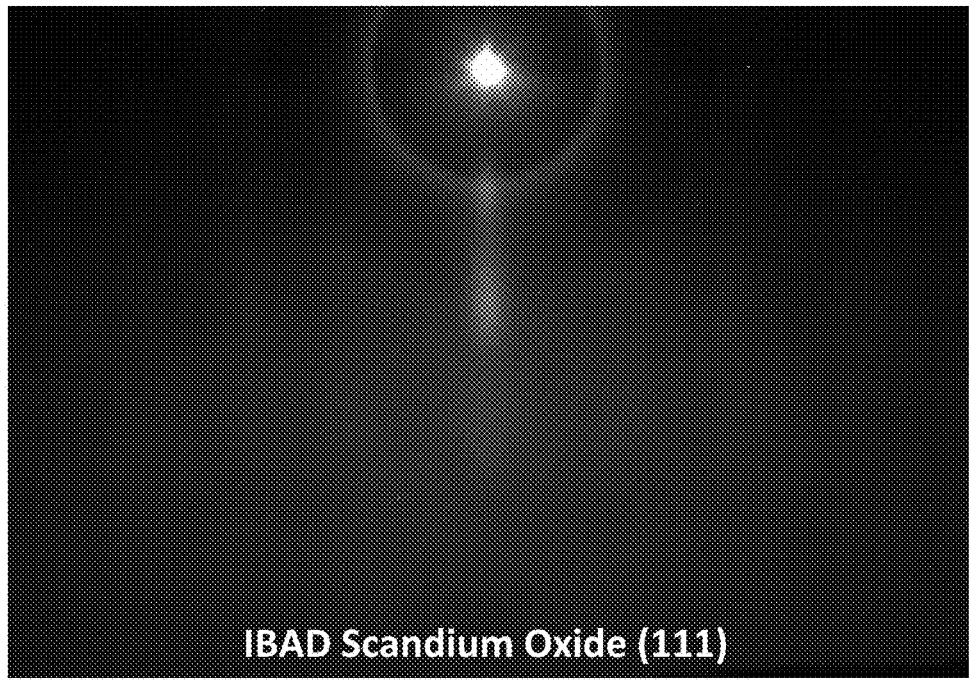
FIG. 19A is a RHEED image of an IBAD-$Sc_2O_3$ film after deposition with (111) out of plane orientation (replaces FIG. 14).
Figure 19B:
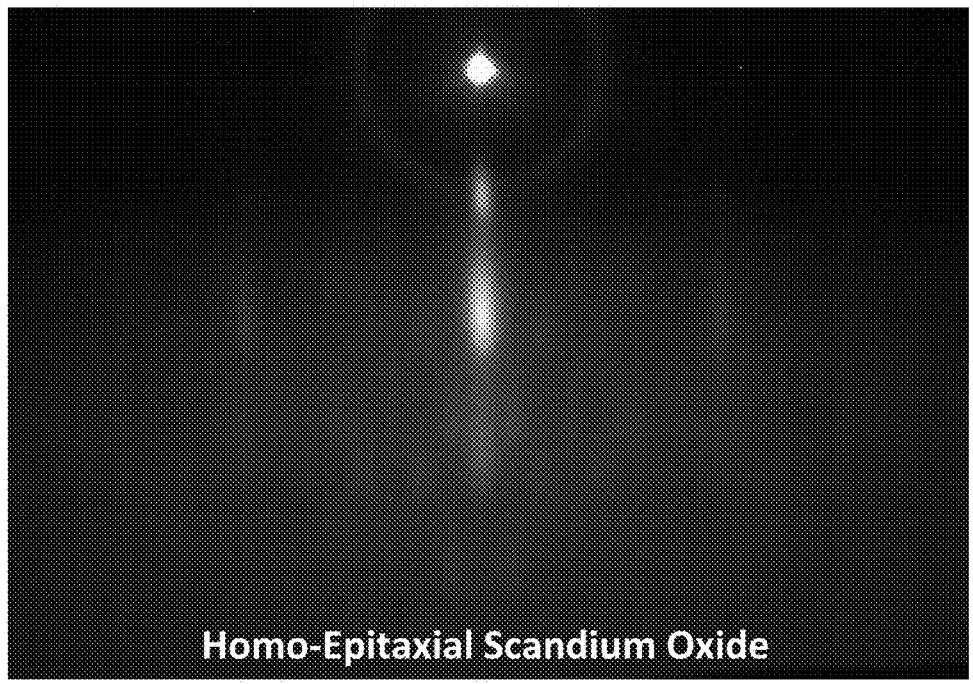
FIG. 19B is a RHEED image after deposition of a homoepitaxial $Sc_2O_3$ layer on top of the IBAD-$Sc_2O_3$.

FIGS. 19A-B, show RHEED images of IBAD-$Sc_2O_3$ and homoepitaxial $Sc_2O_3$ on top of IBAD-$Sc_2O_3$, respectively, with (111) orientation. Similar to $CeO_2$ IBAD layers with (111) orientation can be obtained under the right conditions, in this case the same conditions as for $CeO_2$ IBAD. IBAD-$Sc_2O_3$ texturing is formed on the amorphous SDP deposited $Al_2O_3$ layers.

Figure 20:
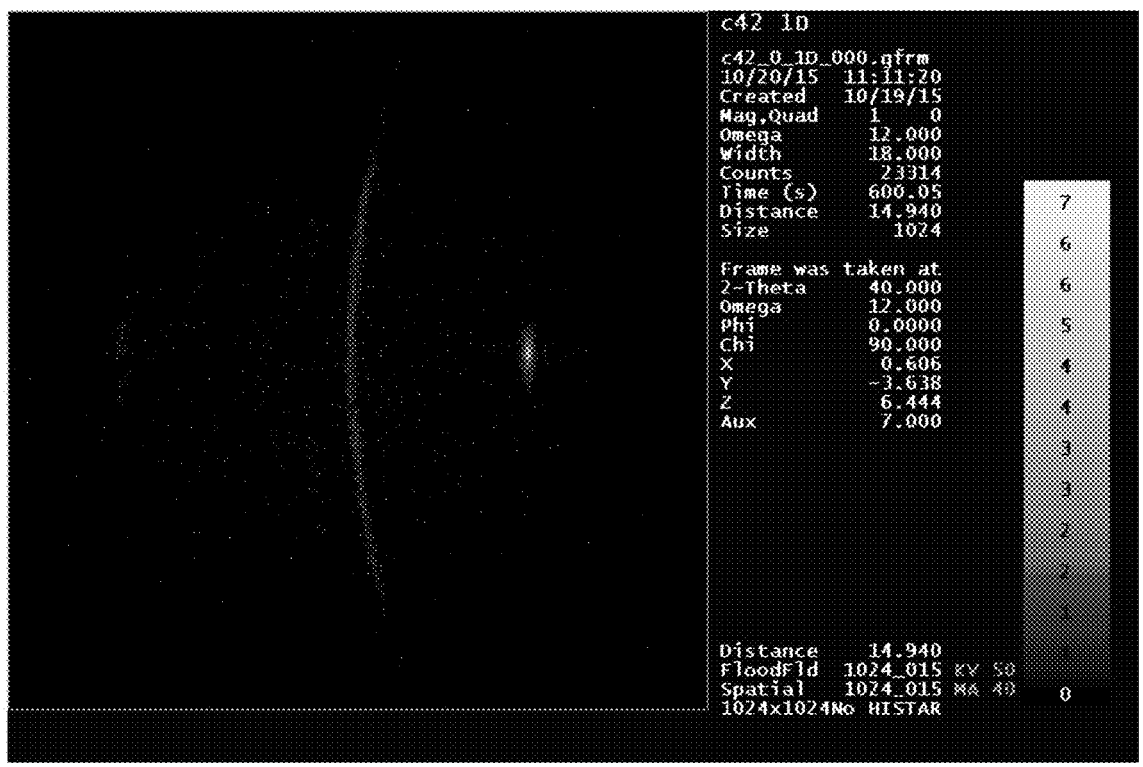
FIG. 20 is an X-ray theta-2theta scan of the $Sc_2O_3$ film oriented by IBAD texturing on a polycrystalline metal foil.
Figure 21:
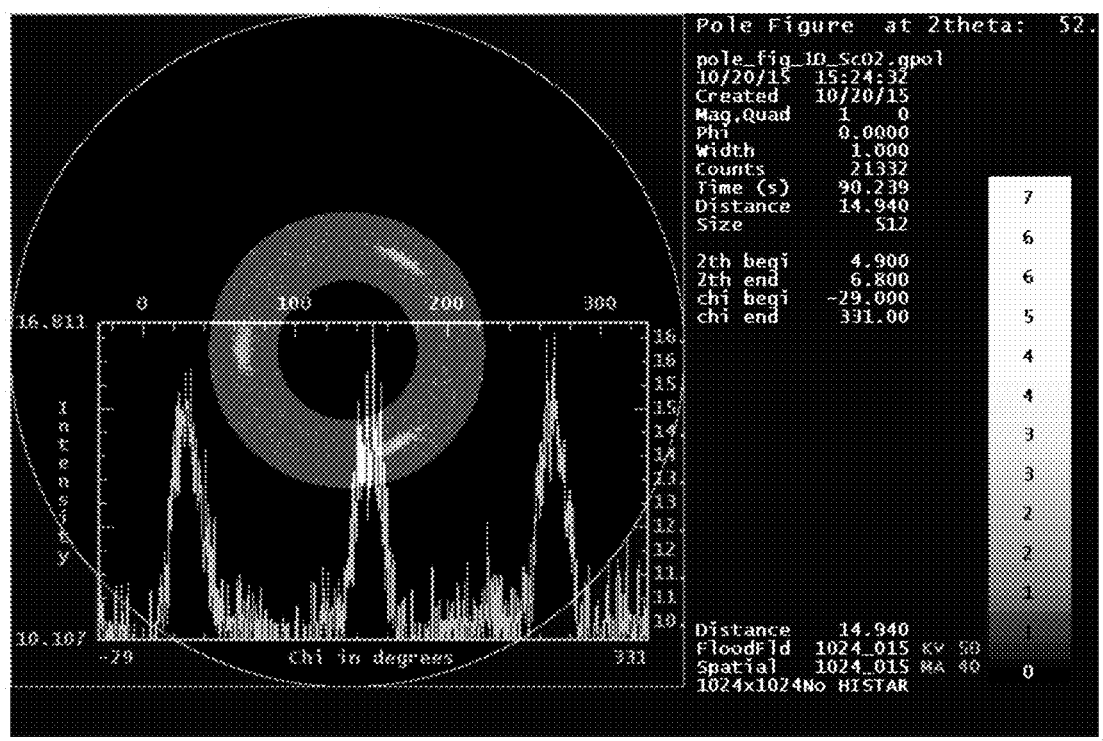
FIG. 21 is an X-ray pole figure for (440) peak in the $Sc_2O_3$ biaxially oriented film.

FIG. 20 shows the theta-2*theta scan of the IBAD-$Sc_2O_3$ film with a homoepitaxial layer on top of the IBAD layer. The bright spot on the right is the (222) reflection of $Sc_2O_3$ and the ring on the left represents the polycrystalline metal substrate. The main peak visible is due to the (111)-oriented $Sc_2O_3$ material. FIG. 21 shows the pole figure for the (440) pole of the $Sc_2O_3$ with 3-fold symmetry. These two x-ray scans demonstrate biaxial orientation for the $Sc_2O_3$ layer.

Example 2

Figure 25A:
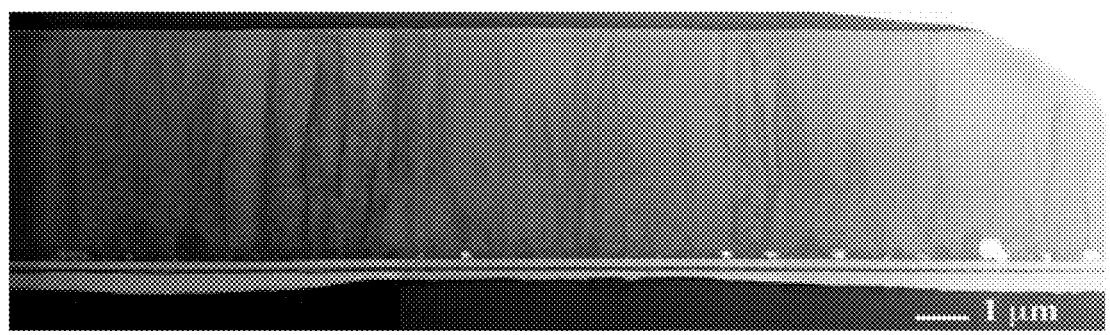
FIG. 25A is a transmission electron micrograph of an LED structure cross section. The LED structure is shown at the top of the GaN layer.
Figure 25B:
FIG. 25B is a detail of FIG. 25A.
Figure 26:
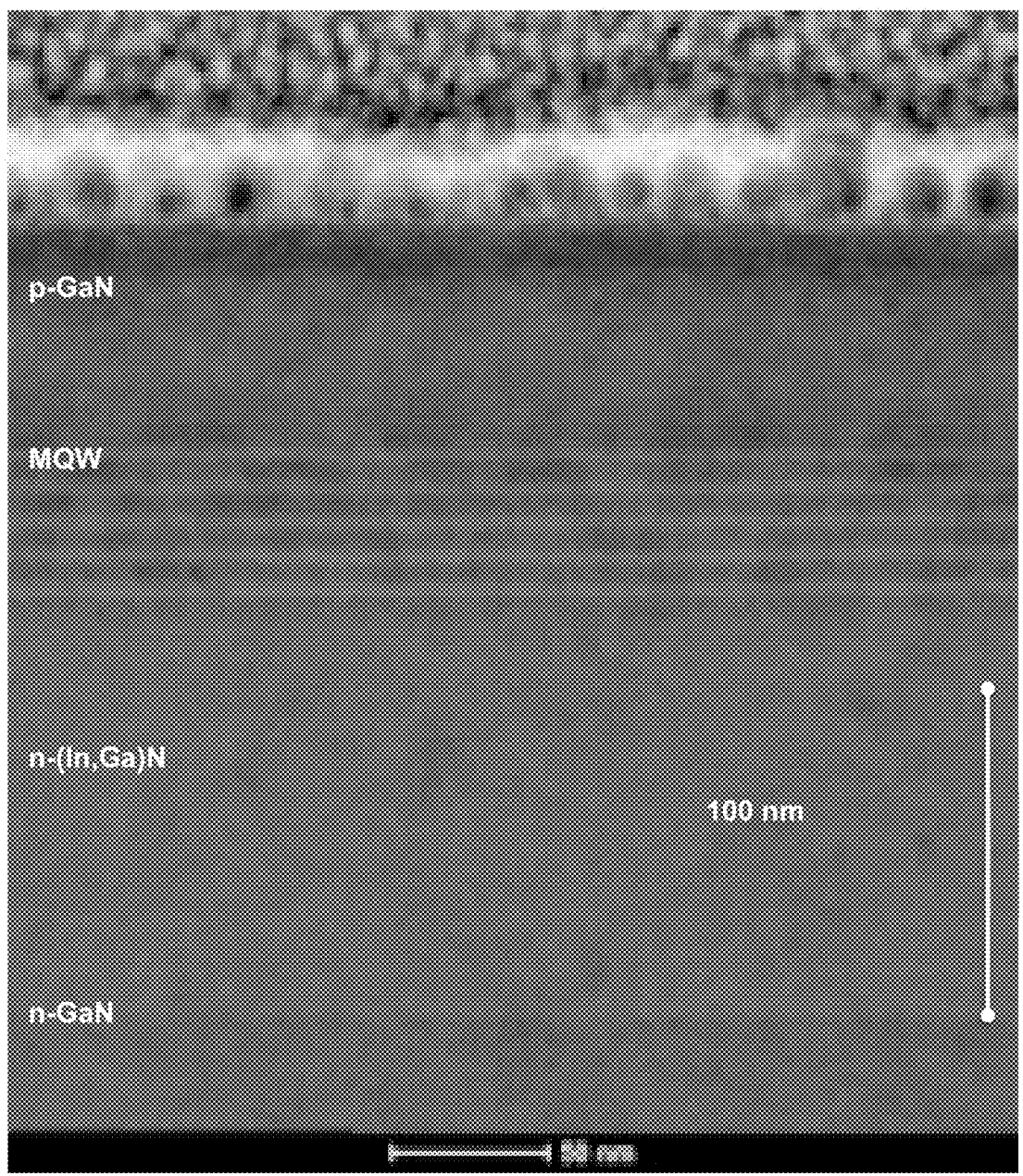
FIG. 26 is a micrograph having a higher magnification than that of FIG. 25, showing the LED multi-quantum well (MQW) structure InGaN/GaN on top of the GaN layer. The lighter regions indicate InGaN.
Figure 30:
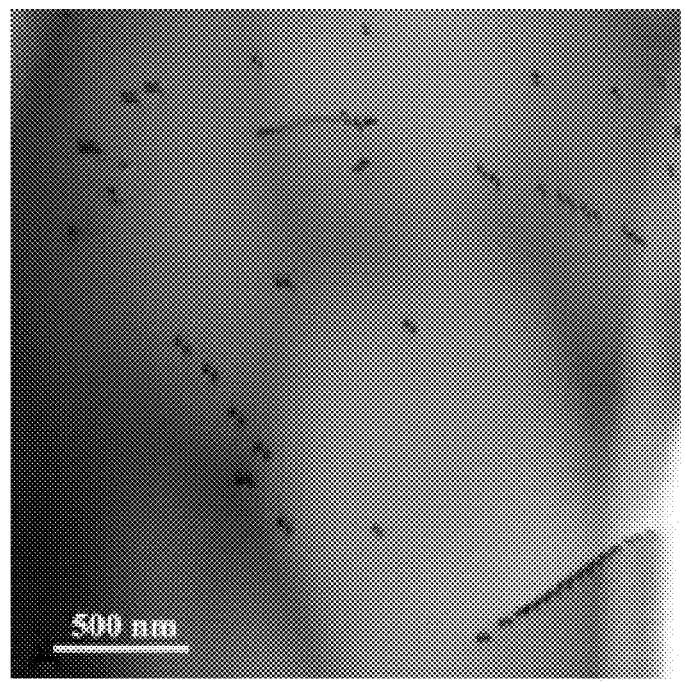
FIG. 30 is a plan-view transmission electron micrograph of GaN-on-metal showing threading dislocations with a density (TDD) of ~$6 \times 10^8/cm^2$.

A thick layer of GaN was deposited on an IBAD template. Typically GaN is 4 to 6 micrometers in thickness, the top part of which is n-doped with Si, as can be seen in FIGS. 25A and 25B. FIG. 30 shows dislocations in the structure. As shown in FIG. 26, on top of the GaN layer an LED structure pn junction is grown, together with a multi-quantum well (MQW) structure, which is a multilayer of 5 alternating InGaN and GaN layers. On top of the MQW is p-doped electron blocking layer followed by the p-GaN doped with Mg. Such a heterostructure is standard for making LEDs in industry.

Figure 27:
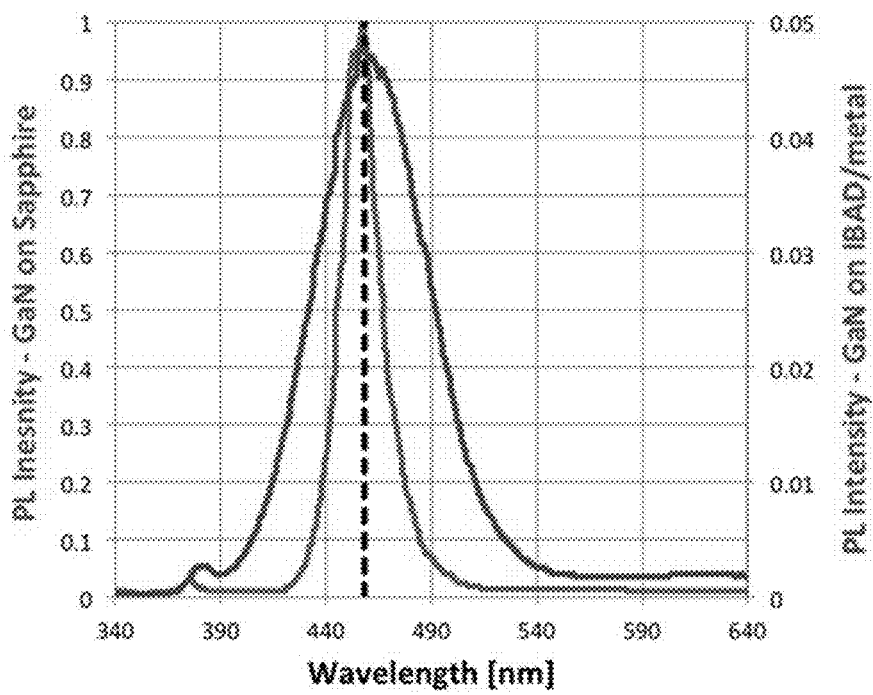
FIG. 27 is a graph showing photoluminescence (PL) data of LEDs fabricated on sapphire (in blue) and on an IBAD template on metal foil (in red). The PL peak for the IBAD LED is broader than the sapphire LED and lower intensity. In this case the IBAD LED is about 15% of the integrated PL intensity of the sapphire LED.
Figure 28:
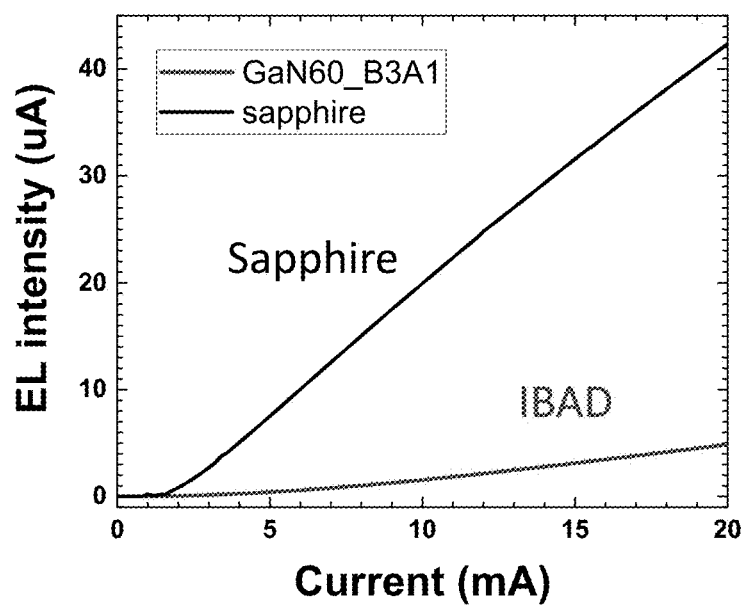
FIG. 28 is a graph showing the light-current (LI) curve for LED devices fabricated on single-crystal sapphire and on an IBAD template prepared on metal foil.
Figure 29:
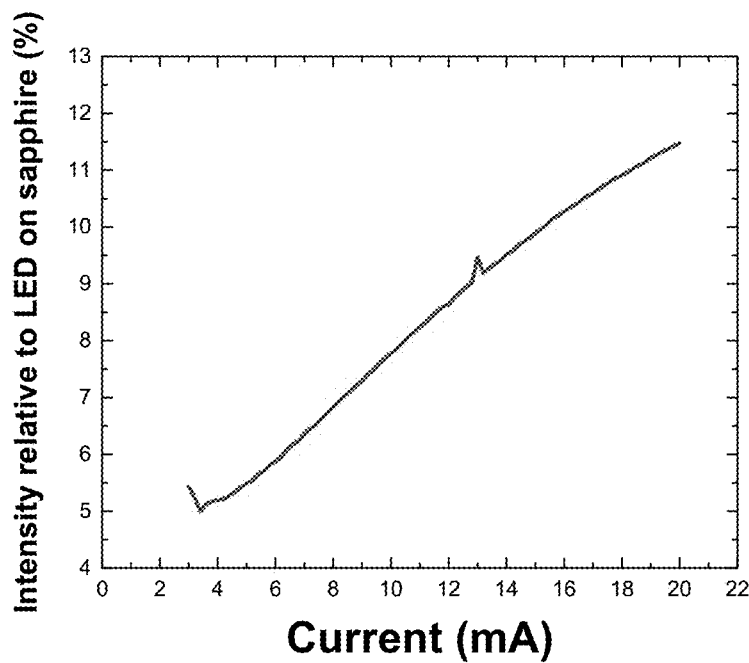
FIG. 29 is a graph showing the intensity ratio for IBAD LED vs sapphire LED from the LI curves of FIG. 28.

Performance of such an LED device was measured as compared to LEDs prepared on single-crystal sapphire, which is a standard substrate in industry. Results are shown in FIGS. 27-29. Comparisons were done with photoluminescence (PL) (shining a light on the device), and electroluminescence (EL) (passing a current through the device), light measurements. For the first devices fabricated PL shows between 10 and 40% of light in IBAD LEDs compared to standard sapphire LEDs. EL of IBAD LEDs shows up to 12% (and increasing) of the sapphire LEDs. The EL device characteristics are dominated by leakage due to shorts in the current devices, although the performance should improve significantly as the material quality of the GaN layers improves.

Devices

Figures 33A, 33B:
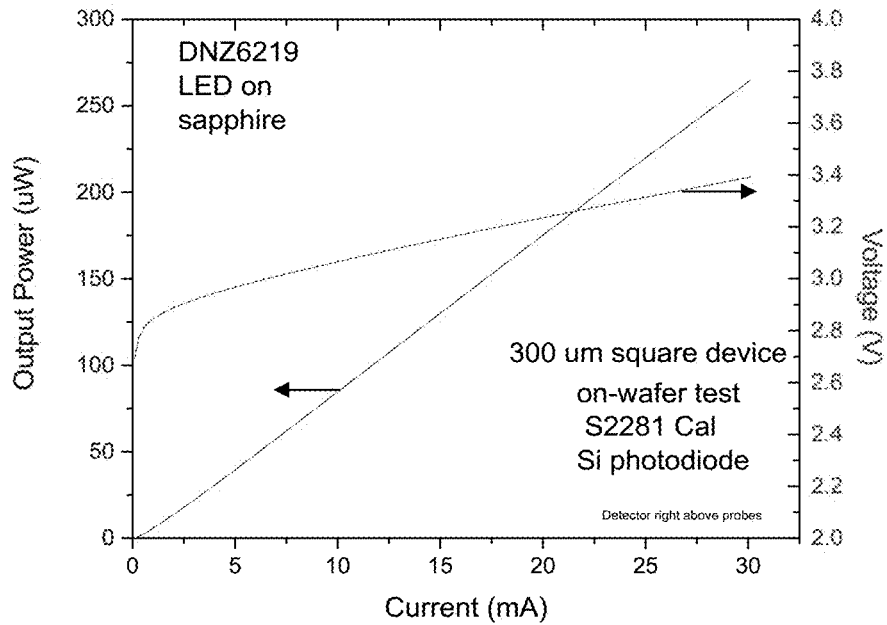
FIGS. 33A and 33B are graphs of voltage-current (VI) and light-current (LI) for LED devices fabricated on single-crystal sapphire substrate and on a GaN-on-metal template, respectively.
Figure 34:
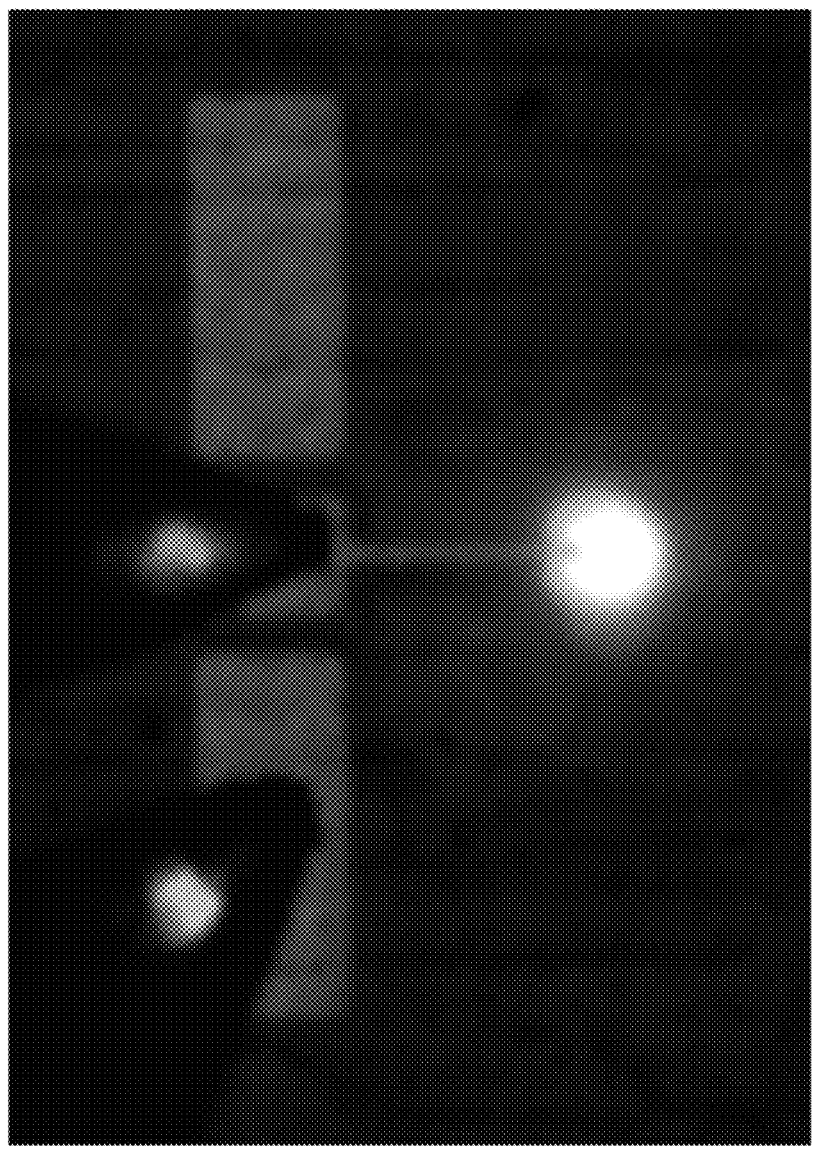
FIG. 34 is an optical photograph of a 30 micron diameter patterned LED structure on a metal foil.

Embodiments of the present invention are structures to improve certain aspects of, enable new functionalities in, and scale-up manufacturing of Group-III devices. In some embodiments, packaged InGaN LED devices are simplified, thereby reducing their cost significantly. An embodiment of the present invention is a light-emitting LED device consisting of an InGaN p-n diode with a multiple-quantum-well (MQW) active region, fabricated directly on a metal foil substrate by use of an IBAD textured template prepared on the metal prior to GaN deposition. Such a device is shown in FIGS. 32A, 32B, 32C, and 34. FIGS. 33A and 33B show test results for two such devices.

Figure 35:
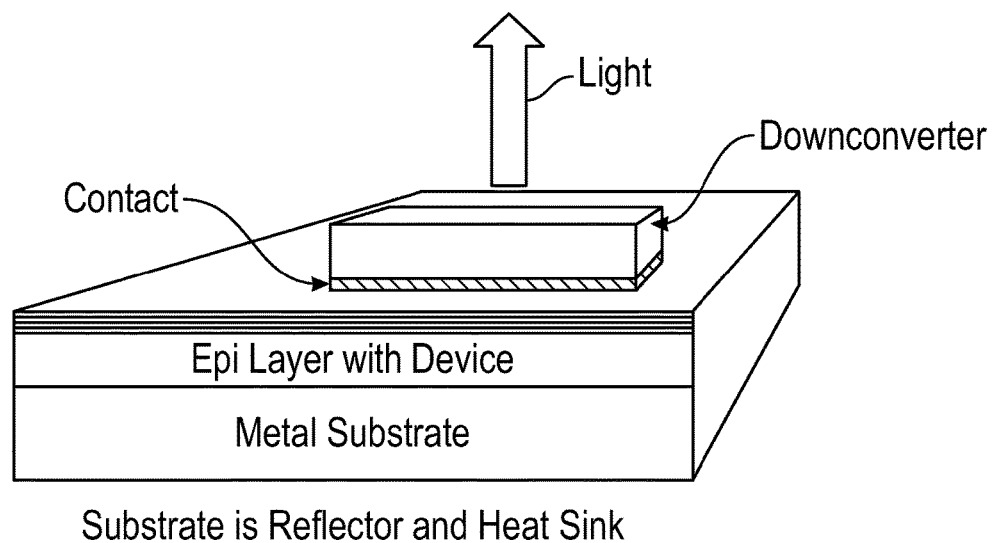
FIG. 35 is a schematic of an LED on a metal substrate.

The present invention enables large-area deposition of Group-III materials on flexible metal sheets. IBAD texturing enables high-quality epitaxial materials can be deposited on appropriate metal substrates while approaching the performance of epitaxial materials on single-crystal substrates such as sapphire. FIG. 35 shows a schematic of an LED fabricated on a metal foil substrate. The LED is preferably pre-packaged on the metal substrate and does not necessarily require a transfer to another substrate before application. For example, micro-LED's don't have to be transferred to a different substrate and/or backplane. Conducting layers and phosphors can be printed on top of the LED metal foil sheets.

Figure 36:
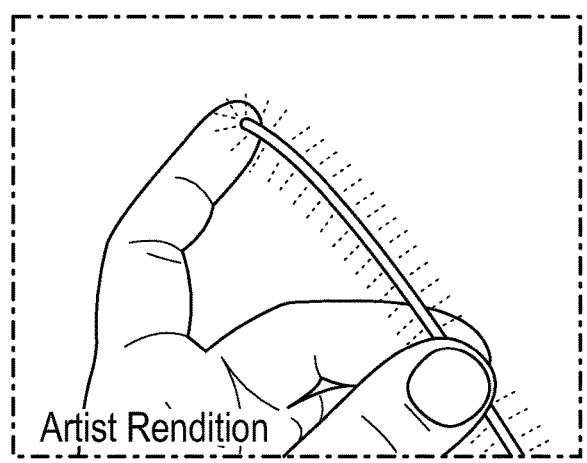
FIG. 36 is an artist's rendition of a Light Emitting Strip manufactured on a strip of metal

FIG. 36 shows an artist's rendition of a light emitting strip that can be fabricated using the GaN-on-metal technology of the present invention. Instead of point sources of light that LEDs are typically today, Light Emitting Strips (LESs) and Sheets become possible and economically feasible using the present invention. In this approach light emitting areas are patterned over significantly larger areas, reducing the required current density. The edge of an LES preferably comprises bus bars to carry higher currents along the length of the strip. LESs have the advantage of being a continuous light source, compared to conventional LEDs which have a pixelated nature in the source emitter. By spreading the light over a larger area, one also obtains a lower operating temperature, in addition to the benefits provided by the lower thermal resistance of the devices. A metal strip light source has the additional benefit of being flexible and conformable.

The GaN-on-metal approach for LEDs has many advantages when compared to GaN-on-sapphire, including:

A flexible substrate enables roll-to-roll processing (R2R). R2R in turn enables scaled up manufacturing and implementation of printed electronics technologies. It is easy to scale manufacturing from 6-inch substrates to km-long webs of metal foil. This scale up alone will yield significant reduction in cost.

Better thermal conduction of the substrate and uniformity in production should ultimately result in higher manufacturing yields.

The coefficient of thermal expansion (CTE) of the metal substrate is better matched to that of GaN. CTE of molybdenum metal is $5.5 \times 10^{-6}$/K, compared to GaN of 5.6, a 2% mismatch which can be further reduced by use of a molybdenum-copper alloy. Sapphire CTE is about 7.5, causing a significant bowing of substrate upon cool down after high temperature growth.

There is potentially a better lattice match of the substrate with GaN, once better lattice match materials are implemented in IBAD. Sapphire has a 16% lattice mismatch. The IBAD material, $CeO_2$ is also 16%, but other materials that are known to be amendable to IBAD texturing are only a few % mismatched to GaN.

Simpler packaging of LEDs is due to the use of metal substrate as both a reflector and a heat sink for the LED. With typical LEDs, a reflector metal is deposited on a roughened surface of the LED in backend processing. A rough surface is preferred since the light needs to bounce a few times before exiting the LED. Also, in the course of packaging the LED is bonded to a separate heat sink. In contrast, in embodiments of the present invention the starting metal substrate preferably has a rough surface and is used as a built-in reflector for the light emitted by the LED. The metal substrate such as molybdenum can additionally be coated with a higher reflectivity material for better reflectance at shorter wavelengths, where InGaN LED emitters are most efficient. The metal substrate furthermore preferably has a high enough thermal conductivity (142 W/m·K for molybdenum, compared to sapphire at 25 W/m·K) and thickness to be an effective heat sink for heat generated by the LED, without the need for substrate removal even at high power requirements. Thus, with some embodiments of LEDs of the present invention, no external heat sink or reflector is required.

The simplified packaging coupled with roll-to-roll processing of devices, among other aspects of applying phosphors and other down converters and printing of contacts, such as screen printing and laser etching, yield significantly lower costs for LEDs. Cost per unit area is expected to be >10× lower once roll-to-roll processes are implemented.

The ability to reduce droop due to larger area LED devices is possible. Since the cost of epi area is reduced, larger areas can be utilized, thus reducing current densities in operating LEDs. This in turn will increase efficiency of devices by reducing the droop.

A reduction in thermal droop can be achieved due to the reduction in thermal resistance by utilizing a thin metal substrate for the LED device. It is estimated that the operating temperature of LEDs on metal will be about ½ that of LEDs on sapphire. Thus, even without a heat sink, high brightness LED's will be cool to the touch, unlike current ones.

More robust operation and longer lifetimes can be achieved due to lower temperature of operation because of better thermal resistance. This is especially applicable to light downconverters, such as phosphors, that are placed on LEDs.

Large-area GaN sheets also enable monolithic integration of various GaN-based devices, such as LEDs and power transistors, to control the current in the LEDs.

GaN power devices, such as HEMT, will also benefit from some of the features described above, in particular better thermal management and scaled up manufacturing.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. An electronic or optoelectronic device comprising a substrate on which an active region of the device was grown, said substrate acting as a reflector, the device further comprising an epitaxial hexagonal crystal layer and a layer of a cubic material having a <111> out of plane orientation and having an in-plane crystalline texture with a full width half maximum (FWHM) less than or equal to approximately 15°;
wherein the layer of cubic material has an in-plane crystalline texture having a FWHM of less than or equal to approximately 12°.

2. The device of claim 1 selected from the group consisting of LED, MOSFET, MESFET, HEMT, Heterojunction FET, heterojunction bipolar transistor (HBT), thin-film transistor, sensor, memristor, laser diode (LD), SAW device, spintronic device, photodetector, and photovoltaic (PV) diode.

3. The device of claim 1 wherein said substrate is a heat sink.

4. The device of claim 3 wherein said substrate has a thermal conductivity greater than approximately 25 W/m·K.

5. The device of claim 4 wherein said substrate has a thermal conductivity greater than approximately 50 W/m·K.

6. The device of claim 1 wherein said substrate comprises a metal or alloy.

7. The device of claim 1 wherein said substrate is flexible.

8. The device of claim 1 wherein said substrate is not a single crystal.

9. The device of claim 1 comprising a light emitting region which is two-dimensional and not one or more point sources.

10. The device of claim 9 in the form of a sheet or strip.

11. The device of claim 1 comprising an LED on a metal substrate, wherein an operating temperature of the LED is less than approximately two thirds that of an LED on sapphire.

12. The device of claim 11 wherein an operating temperature of the LED is less than approximately one half that of an LED on sapphire.

13. The device of claim 1 that is cool to touch during operation.

14. The device of claim 1 integrated into an electronic system.

15. The device of claim 14 wherein said electronic system is selected from the group consisting of an LED-based luminaire, a light emitting strip, a light emitting sheet, an optical display, and a MicroLED display.

16. The device of claim 1 wherein the epitaxial hexagonal crystal layer comprises a group III-nitride semiconductor.

17. The device of claim 16 wherein the epitaxial hexagonal crystal layer comprises GaN.

18. The device of claim 1 wherein the layer of cubic material has been textured by ion beam-assisted deposition (IBAD).

19. The device of claim 1 wherein the layer of cubic material is selected from the group consisting of MgO, $CeO_2$, a bixbyite structure, $Sc_2O_3$, $Y_2O_3$, $Al_2O_3$, a fluorite structure, TiN, a rock salt structure, $CaF_2$, cubic $ZrO_2$, $HfO_2$, $ScO_x$, and $Mn_2O_3$.

20. The device of claim 1 wherein the epitaxial hexagonal crystal layer comprises GaN and the substrate comprises molybdenum, tungsten, tantalum, alloys thereof, Mo—Cu, or TZM.

21. The device of claim 1 comprising a base layer disposed between the substrate and the layer of cubic material.

22. The device of claim 21 wherein the base layer comprises amorphous $Al_2O_3$, $Y_2O_3$, or $SiO_2$.

23. The device of claim 1 comprising one or more epitaxial buffer layers disposed between the layer of cubic material and the epitaxial hexagonal crystal layer.

24. The device of claim 23 wherein the epitaxial buffer layers each have a lattice parameter that successively provides a transition from the lattice parameter of the cubic material to the lattice parameter of the epitaxial hexagonal crystal layer.

25. The device of claim 24 wherein the epitaxial hexagonal crystal layer comprises GaN and the epitaxial buffer layers comprise a layer of $Sc_2O_3$, a layer of Zr, and a layer of AlN.

26. An electronic or optoelectronic device comprising a substrate on which an active region of the device was grown, said substrate acting as a reflector;
wherein said substrate is a heat sink.

27. The device of claim 26 selected from the group consisting of LED, MOSFET, MESFET, HEMT, Heterojunction FET, heterojunction bipolar transistor (HBT), thin-film transistor, sensor, memristor, laser diode (LD), SAW device, spintronic device, photodetector, and photovoltaic (PV) diode.

28. The device of claim 26 wherein said substrate has a thermal conductivity greater than approximately 25 W/m·K.

29. The device of claim 28 wherein said substrate has a thermal conductivity greater than approximately 50 W/m·K.

30. The device of claim 26 wherein said substrate comprises a metal or alloy.

31. The device of claim 26 wherein said substrate is flexible.

32. The device of claim 26 wherein said substrate is not a single crystal.

33. The device of claim 26 integrated into an electronic system.

34. The device of claim 33 wherein said electronic system is selected from the group consisting of an LED-based luminaire, a light emitting strip, a light emitting sheet, an optical display, and a MicroLED display.

35. An electronic or optoelectronic device comprising a substrate on which an active region of the device was grown, said substrate acting as a reflector;
wherein the device comprises a light emitting region which is two-dimensional and not one or more point sources.

36. The device of claim 35 selected from the group consisting of LED, MOSFET, MESFET, HEMT, Heterojunction FET, heterojunction bipolar transistor (HBT), thin-film transistor, sensor, memristor, laser diode (LD), SAW device, spintronic device, photodetector, and photovoltaic (PV) diode.

37. The device of claim 35 wherein said substrate comprises a metal or alloy.

38. The device of claim 35 wherein said substrate is flexible.

39. The device of claim 35 wherein said substrate is not a single crystal.

40. The device of claim 35 in the form of a sheet or strip.

41. The device of claim 35 integrated into an electronic system.

42. The device of claim 41 wherein said electronic system is selected from the group consisting of an LED-based luminaire, a light emitting strip, a light emitting sheet, an optical display, and a MicroLED display.

* * * * *

UNITED STATES PATENT AND TRADEMARK OFFICE
CERTIFICATE OF CORRECTION

PATENT NO. : 10,243,105 B2
APPLICATION NO. : 15/675598
DATED : March 26, 2019
INVENTOR(S) : Vladimir Matias and Christopher Yung It is certified that error appears in the above-identified patent and that said Letters Patent is hereby corrected as shown below:

On the Title Page

Item (72) should read:
(72) Inventors: Vladimir Matias, Santa Fe, NM (US)
               Christopher Yung, Louisville, CO (US)

Signed and Sealed this
Twelfth Day of May, 2020

Andrei Iancu
*Director of the United States Patent and Trademark Office*